(12) United States Patent
Park et al.

(10) Patent No.: US 9,536,968 B2
(45) Date of Patent: Jan. 3, 2017

(54) SEMICONDUCTOR DEVICES INCLUDING CONTACT PATTERNS HAVING A RISING PORTION AND A RECESSED PORTION

(71) Applicants: Sungil Park, Suwon-si (KR); Munhyeon Kim, Seoul (KR); Woonggi Kim, Hwaseong-si (KR); Keunhwi Cho, Seoul (KR); Hwichan Jun, Yongin-si (KR); Dongwon Kim, Seongnam-si (KR); Daewon Ha, Seoul (KR)

(72) Inventors: Sungil Park, Suwon-si (KR); Munhyeon Kim, Seoul (KR); Woonggi Kim, Hwaseong-si (KR); Keunhwi Cho, Seoul (KR); Hwichan Jun, Yongin-si (KR); Dongwon Kim, Seongnam-si (KR); Daewon Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/715,643

(22) Filed: May 19, 2015

(65) Prior Publication Data

US 2016/0126326 A1 May 5, 2016

(30) Foreign Application Priority Data

Oct. 29, 2014 (KR) .................. 10-2014-0148527

(51) Int. Cl.
*H01L 29/417* (2006.01)
*H01L 29/45* (2006.01)
*H01L 29/06* (2006.01)
*H01L 29/78* (2006.01)
*H01L 29/66* (2006.01)

(52) U.S. Cl.
CPC ..... *H01L 29/41775* (2013.01); *H01L 29/0653* (2013.01); *H01L 29/41791* (2013.01); *H01L 29/456* (2013.01); *H01L 29/66545* (2013.01); *H01L 29/78* (2013.01); *H01L 29/785* (2013.01)

(58) Field of Classification Search
CPC ................... H01L 29/66795; H01L 29/66545; H01L 29/785; H01L 29/665; H01L 29/165; H01L 29/7848; H01L 21/76897; H01L 29/0847
USPC ........ 257/401, 288, 384, 192; 438/283, 197, 438/586
See application file for complete search history.

(56) References Cited

U.S. PATENT DOCUMENTS

| | | | |
|---|---|---|---|
| 7,851,283 B2 | 12/2010 | Anderson et al. | |
| 8,252,651 B2 | 8/2012 | Kawasaki | |
| 8,362,574 B2 | 1/2013 | Kawasaki et al. | |
| 2009/0184357 A1* | 7/2009 | Wu | H01L 21/26586 257/303 |
| 2013/0277752 A1 | 10/2013 | Glass et al. | |
| 2014/0110755 A1 | 4/2014 | Colinge | |
| 2014/0203348 A1* | 7/2014 | Suk | H01L 29/66545 257/327 |
| 2015/0279996 A1* | 10/2015 | He | H01L 29/7851 257/288 |

(Continued)

*Primary Examiner* — David Vu
*Assistant Examiner* — Jonathan Han
(74) *Attorney, Agent, or Firm* — Myers Bigel, P.A.

(57) ABSTRACT

Semiconductor devices may include a gate pattern and a contact pattern disposed on an active region. The contact pattern may include a recessed portion near the gate pattern, and a rising portion away from the gate pattern. The gate pattern may include a gate insulating layer and a gate electrode disposed on the gate insulating layer. An upper surface of the recessed portion may be lower than an upper surface of the rising portion.

20 Claims, 35 Drawing Sheets

(56) References Cited

U.S. PATENT DOCUMENTS

2015/0364326 A1* 12/2015 Xie .................... H01L 29/6653
257/288

* cited by examiner

SEMICONDUCTOR DEVICES INCLUDING CONTACT PATTERNS HAVING A RISING PORTION AND A RECESSED PORTION

CROSS-REFERENCE TO RELATED APPLICATION

This application claims priority under 35 U.S.C. §119 to Korean Patent Application No. 10-2014-0148527 filed on Oct. 29, 2014, the disclosure of which is hereby incorporated by reference in its entirety.

BACKGROUND

Field

Embodiments of the inventive concept relate to semiconductor devices including a contact pattern having a rising portion and a recessed portion, and methods of fabricating the semiconductor devices.

Description of Related Art

As a degree of integration of semiconductor devices increases, parasitic capacitance between gate patterns and contact patterns and/or between the respective contact patterns increases in non-negligible. Accordingly, many studies and ideas to reduce the parasitic capacitance therebetween have been made and suggested. However, it is not easy to reduce a thickness of a gate pattern due to an increase of resistance of the gate pattern, and to reduce a width of a contact pattern due to an increase of resistance of the contact pattern.

SUMMARY

Embodiments of the inventive concept provide semiconductor devices including a contact pattern having a rising portion and a recessed portion so as to reduce parasitic capacitance.

Embodiments of the inventive concept also provide methods of fabricating semiconductor devices including a contact pattern having a rising portion and a recessed portion.

According to some example embodiments of the inventive concept, a semiconductor device includes a gate pattern and a contact pattern disposed on an active region. The gate pattern includes a gate insulating layer and a gate electrode disposed on the gate insulating layer. The contact pattern includes a recessed portion near the gate pattern, and a rising portion away from the gate pattern. An upper surface of the recessed portion may be lower than an upper surface of the rising portion.

According to some example embodiments of the inventive concept, a semiconductor device includes a gate pattern disposed on an active region, a contact pattern disposed adjacent to the gate pattern on the active region, and an insulating pattern and a via pattern formed on the contact pattern. The contact pattern includes a rising portion having an upper surface disposed at the same level as or higher than an upper surface of a gate electrode of the gate pattern, and a recessed portion having an upper surface lower than the upper surface of the rising portion. The insulating pattern mat be formed on the recessed portion, and the via pattern may be formed on the rising portion.

According to some example embodiments of the inventive concept, a semiconductor device includes isolation regions defining a plurality of parallel active regions. The isolation regions includes trenches recessed such that the active regions have a protruding shape, and trench insulators partially filling the trenches to expose side surfaces of the active regions.

Details of embodiments are included in the detailed description and drawings.

BRIEF DESCRIPTION OF THE DRAWINGS

The foregoing and other features and advantages of the inventive concept will be apparent from the more particular description of example embodiments of the inventive concept, as illustrated in the accompanying drawings in which like reference numerals denote the same respective parts throughout the different views. The drawings are not necessarily to scale, emphasis instead being placed upon illustrating the principles of the inventive concept. In the drawings:

FIGS. 3A to 14D are cross-sectional views for describing a method of fabricating a semiconductor device in accordance with example embodiments of the inventive concept. FIGS. 3A to 14A are cross-sectional views taken along the line I-I' of FIG. 1, FIGS. 3B to 14B are cross-sectional views taken along the line II-II' of FIG. 1, FIGS. 5C to 14C are cross-sectional views taken along the line of FIG. 1, and FIGS. 11D to 14D are cross-sectional views taken along the line IV-IV' of FIG. 1;

FIGS. 17 to 23C are cross-sectional views for describing a method of fabricating a semiconductor device in accordance with example embodiments of the inventive concept. FIGS. 17 to 20 and FIGS. 21A to 23A are cross-sectional views taken along the line V-V' of FIG. 15, FIGS. 21B to 23B are cross-sectional views taken along the line VI-VI' of FIG. 15, and FIGS. 21C and 23C are cross-sectional views taken along the line VII-VII' of FIG. 15;

DETAILED DESCRIPTION OF EXAMPLE EMBODIMENTS

Figure 1:
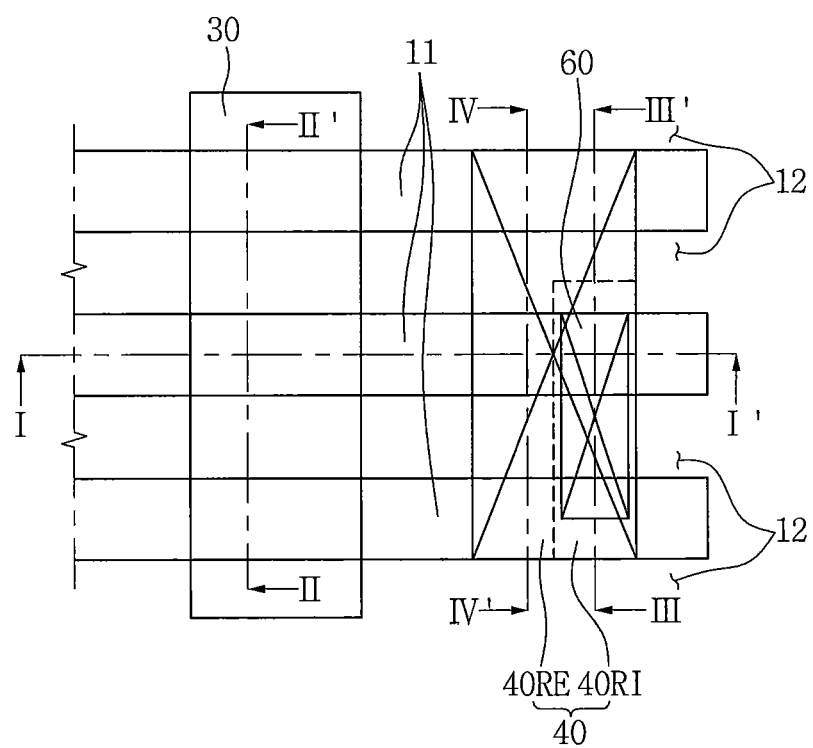
FIG. 1 is a layout of a semiconductor device in accordance with example embodiments of the inventive concept.

Various embodiments will now be described more fully with reference to the accompanying drawings in which some example embodiments are shown. These inventive concept may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the inventive concept is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular form may number one or more, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "connected to" or "coupled to" another element, it can be directly connected to or coupled to the other element or intervening elements may be present. In contrast, when an element is referred to as being "directly connected to" or "directly coupled to" another element, there are no intervening elements present. As used herein, the term "and/or" includes each and any combination of at least one of the referred items.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Like numerals refer to like elements throughout the specification. Accordingly, the same numerals and similar numerals can be described with reference to different drawings, even if not specifically described in the corresponding drawings. Further, when a numeral is not marked in a drawing, the numeral can be described with reference to other drawings.

The term "near" is intended to mean that one among two or more components is disposed within relatively close proximity of a certain other component. For example, it should be understood that when a first end is near a first side, the first end may be closer than a second end to the first side, or the first end may be closer to the first side than to a second side.

FIG. 1 is a layout of a semiconductor device in accordance with example embodiments of the inventive concept. Referring to FIG. 1, a semiconductor device in accordance with example embodiments of the inventive concept may include active regions 11, isolation regions 12 delimiting the active regions 11, a gate pattern 30 crossing the active regions 11, a contact pattern 40 overlapping the active regions 11, and a via pattern 60 overlapping the contact pattern 40. When viewed from a top view, the active regions 11 may be a plurality of bars that are in parallel with each other. Accordingly, the respective active regions 11 may have a line shape in a first cross-sectional view, and a shape spaced apart from each other in a second cross-sectional view perpendicular to the first cross-sectional view.

The contact pattern 40 may include a recessed portion 40RE near to the gate pattern 30 and a rising portion 40RI away from the gate pattern 30. The via pattern 60 may overlap the rising portion 40RI of the contact pattern 40. The via pattern 60 may be divided into a plurality of vias.

FIGS. 2A to 2D are cross-sectional views of a semiconductor device in accordance with example embodiments of the inventive concept, taken along the lines I-I', II-II', III-III', and IV-IV' of FIG. 1. Referring to FIGS. 2A to 2D, a semiconductor device in accordance with example embodiments of the inventive concept may include a gate pattern 30, source/drain regions 15, a contact pattern 40, an insulating pattern 50, and a via pattern 60, which are disposed on the active regions 11. The semiconductor device may further include isolation regions 12 delimiting the active regions 11.

The active regions 11 may protrude above the isolation regions 12 and may be in parallel with each other. The isolation regions 12 may include trenches 12t having bottom surfaces lower than the surfaces of the active regions 11 and trench insulators 12i filled in the trenches 12t. The trench insulators 12i may include silicon oxide.

The gate pattern 30 may be disposed on the active regions 11. The gate pattern 30 may include surface insulating patterns 21, a gate insulating layer 31, a gate barrier layer 32, a gate electrode 33, and gate spacers 35.

The surface insulating patterns 21 may include, for example, oxidized silicon. For example, the surface insulating patterns 21 may be formed by oxidizing surfaces of the active regions 11. Accordingly, the surface insulating patterns 21 may be formed only on the surfaces of the active regions 11.

The gate insulating layer 31 may include, for example, a metal oxide layer such as hafnium oxide (HfO). The gate insulating layer 31 may have a U-shaped cross-section so as to be in contact with upper surfaces of the surface insulating patterns 21 and inner side surfaces of the gate spacers 35.

The gate barrier layer 32 may be formed to have a U-shaped cross-section on the gate insulating layer 31. Accordingly, the gate insulating layer 31 may surround a lower surface and outer side surfaces of the gate barrier layer 32. The gate barrier layer 32 may include a barrier metal compound such as titanium nitride (TiN).

The gate electrode 33 may be formed on the gate barrier layer 32. The gate electrode 33 may have a solid shape in which a lower surface and side surfaces thereof are surrounded by the gate barrier layer 32. The gate electrode 33 may include, for example, a metal such as tungsten (W).

The gate spacers 35 may include inner gate spacers 35*a* and outer gate spacers 35*b*. The inner gate spacers 35*a* may be conformally formed on portions of the surfaces of the active regions 11 and on side surfaces of the gate insulating layer 31. The inner gate spacers 35*a* may include, for example, silicon oxide or silicon nitride. The outer gate spacers 35*b* may be formed on side surfaces of the inner gate spacers 35*a*. The outer gate spacers 35*b* may be formed of, for example, silicon nitride or silicon oxide.

The source/drain regions 15 may include, for example, a SiGe layer, a SiC layer, or a Si layer, which is epitaxially grown on the recessed active regions 11. Lower surfaces of the source/drain regions 15 may be disposed at a lower level than a lower surface of the gate pattern 30. In addition, the lower surfaces of the source/drain regions 15 may be disposed at a lower level than upper surfaces of the trench insulators 12*i* of the isolation regions 12. The source/drain regions 15 may have a polygonal shape such as a diamond. The source/drain regions 15 may be connected with each other in the form of the bridge. Air gaps AG may be formed between the source/drain regions 15 and the trench insulators 12*i*.

The semiconductor device may further include a first interlayer insulating layer 71 covering the active regions 11, the isolation regions 12, and the source/drain regions 15, and surrounding side surfaces of the gate pattern 30. An upper surface of the first interlayer insulating layer 71 and an upper surface of the gate pattern 30 may be coplanar. The first interlayer insulating layer 71 may include, for example, silicon oxide.

The semiconductor device may further include a first stopper layer 81 that is evenly formed on the first interlayer insulating layer 71 and the gate pattern 30. The first stopper layer 81 may include, for example, silicon nitride.

The contact pattern 40 may be disposed on the source/drain regions 15. The contact pattern 40 may include a silicide layer 41 formed on surfaces of the source/drain regions 15 exposed in a contact hole 40H, a contact barrier layer 42 conformally formed on the silicide layer 41 and inner walls of the contact hole 40H, and a contact plug 43 filling the contact hole 40H on the contact barrier layer 42. The silicide layer 41 may include, for example, a metal silicide, such as tungsten silicide (WSi), titanium silicide (TiSi), cobalt silicide (CoSi), or nickel silicide (NiSi). The contact barrier layer 42 may include, for example, titanium nitride (TiN) or another barrier metal layer. The contact plug 43 may include a metal such as W.

The contact pattern 40 may include a rising portion 40RI having a relatively higher surface and a recessed portion 40RE having a relatively lower surface from the substrate 10. For example, an upper surface of the rising portion 40RI may be coplanar with an upper surface of the first stopper layer 81. In some embodiments, the upper surface of the rising portion 40RI may be coplanar with the upper surface of the gate pattern 30. For example, when a planarization process is performed to fully remove the first stopper layer 81 in a process of forming the contact pattern, the upper surface of the rising portion 40RI may become coplanar with the upper surface of the gate pattern 30.

An upper surface of the recessed portion 40RE may be disposed at a lower level than the upper surface of the gate pattern 30.

The contact pattern 40 may have an L-shaped cross-section in one direction, and an I-shaped or l-shaped cross-section in another direction. In some embodiments, the contact pattern 40 may have l-shaped cross-sections in the both directions perpendicular to each other, since the recessed portion 40RE is fully removed while only the rising portion 40RI remains.

The insulating pattern 50 may be formed on the recessed portion 40RE of the contact pattern 40. The insulating pattern 50 may include a blocking layer 51 conformally formed on the upper surface of the recessed portion 40RE of the contact pattern 40 exposed in an insulating hole 50H and on inner walls of the insulating hole 50H, and a filling layer 52 filling the insulating hole 50H on the blocking layer 51. For example, the blocking layer 51 may include an insulating material such as silicon nitride, and the filling layer 52 may include an insulating material such as silicon oxide or silicon nitride. For example, the blocking layer 51 and the filling layer 52 may include the same material such as silicon nitride to form a single material layer.

The semiconductor device may further include a second stopper layer 82 that is evenly formed on the first stopper layer 81 and the contact pattern 40. Upper surfaces of the second stopper layer 82 and the insulating pattern 50 may be coplanar. The second stopper layer 82 may include silicon nitride.

The via pattern 60 may be formed on the rising portion 40RI of the contact pattern 40 to be aligned with the rising portion 40RI. The via pattern 60 may include a via barrier layer 61 conformally formed on the upper surface of the rising portion 40RI of the contact pattern 40 exposed in a via hole 60H and inner walls of the via hole 60H, and a via plug 62 filling the via hole 60H on the via barrier layer 61. The via barrier layer 61 may include, for example, titanium nitride (TiN), tantalum nitride (TaN), or another barrier metal layer. The via plug 62 may include a metal such as W.

The semiconductor device may further include a second interlayer insulating layer 72 surrounding side surfaces of the via pattern 60 on the second stopper layer 82 and the insulating pattern 50. The second interlayer insulating layer 72 may include silicon oxide.

The semiconductor device may further include an interconnection 65 vertically overlapping the via pattern 60 on the second interlayer insulating layer 72. The interconnection 65 may extend in a horizontal direction, and include a metal such as W.

The semiconductor device may further include a third interlayer insulating layer 73 formed on the second interlayer insulating layer 72 to cover the interconnection 65. The third interlayer insulating layer 73 may include silicon oxide.

Figure 2A:
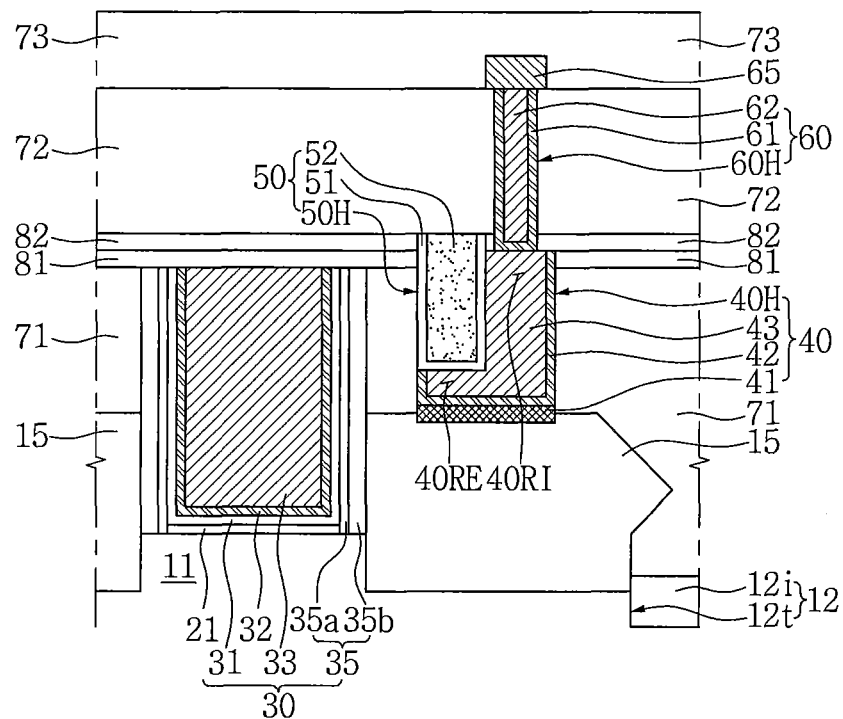
FIGS. 2A to 2D are cross-sectional views of a semiconductor device in accordance with example embodiments of the inventive concept, taken along the lines and IV-IV' of FIG. 1.
Figure 2B:
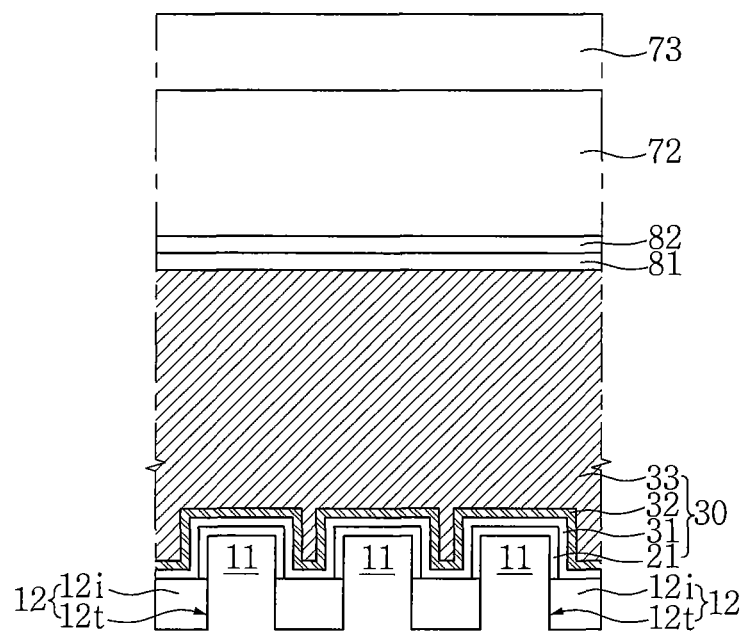
Figure 2C:
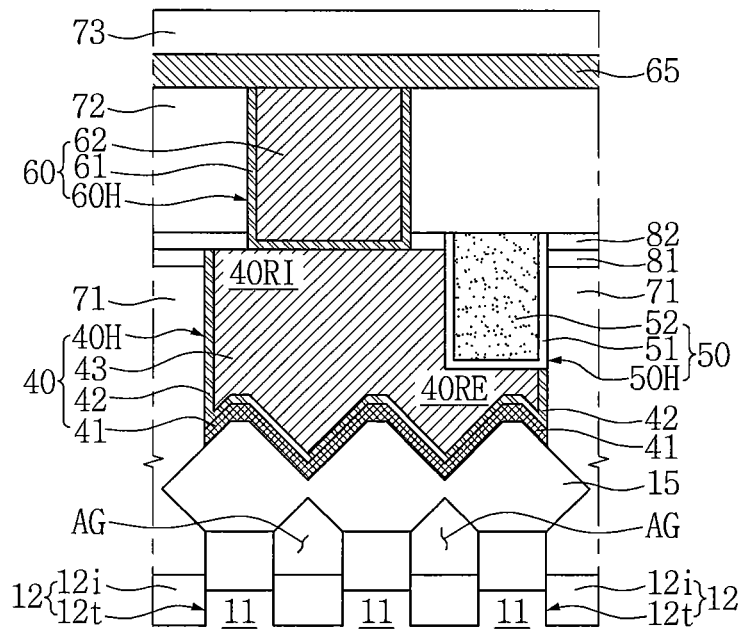
Figure 2D:
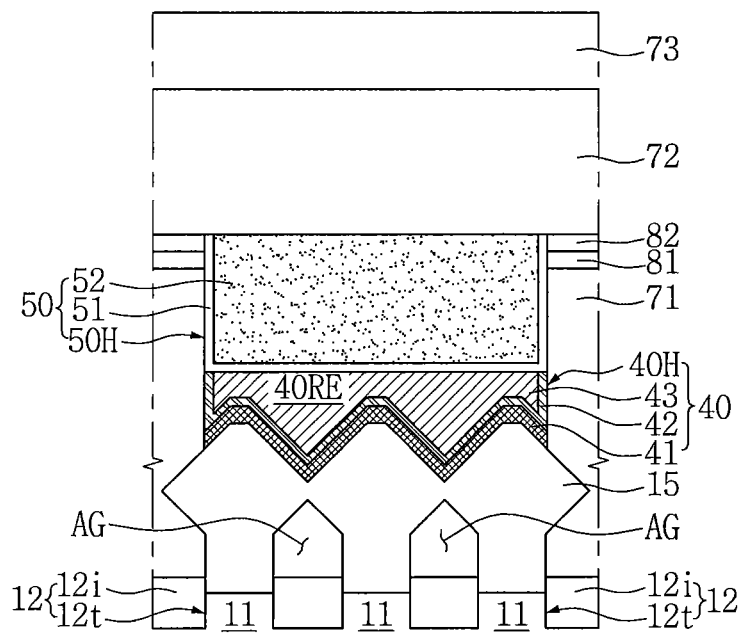
Figure 2E:
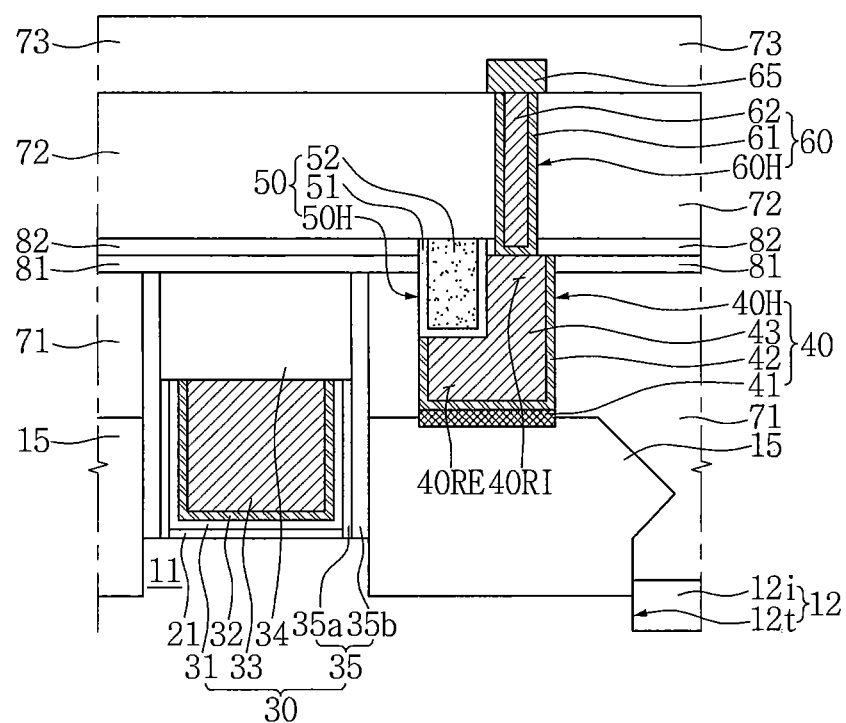
FIG. 2E is a cross-sectional view of a semiconductor device in accordance with example embodiments of the inventive concept, taken along the line of I-I' of FIG. 1.

FIG. 2E is a cross-sectional view of a semiconductor device in accordance with example embodiments of the inventive concept, taken along the line I-I' of FIG. 1. Referring to FIG. 2E, a gate pattern 30 of the semiconductor device in accordance with example embodiments of the inventive concept may further include a gate capping layer 34. The gate capping layer 34 may be disposed on a gate insulating layer 31, a gate barrier layer 32, and a gate electrode 33.

An upper surface of a recessed portion 40RE of a contact pattern 40 may be disposed at a higher level than an upper surface of the gate electrode 33 from the substrate 10.

FIGS. 3A to 14D are cross-sectional views for describing a method of fabricating a semiconductor device in accordance with example embodiments of the inventive concept. FIGS. 3A to 14A are cross-sectional views taken along the line I-I' of FIG. 1, FIGS. 3B to 14B are cross-sectional views taken along the line II-II' of FIG. 1, FIGS. 5C to 14C are cross-sectional views taken along the line of FIG. 1, and FIGS. 11D to 14D are cross-sectional views taken along the line IV-IV' of FIG. 1.

Figure 3A:
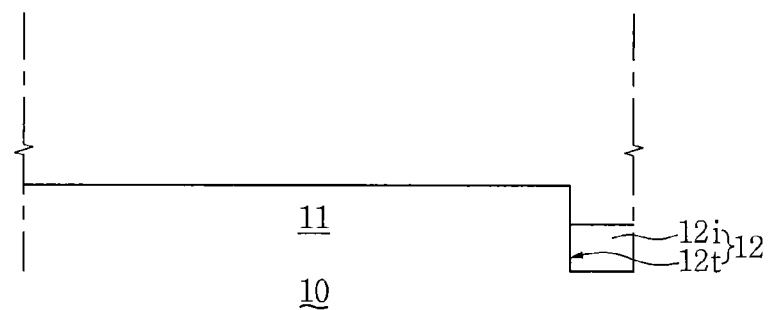
Figure 3B:
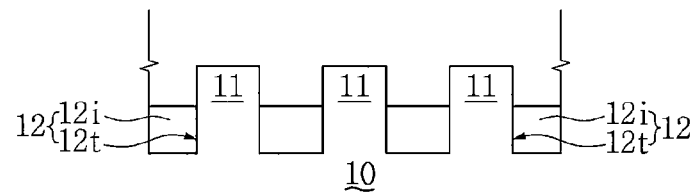

Referring to FIGS. 3A and 3B, the method of fabricating a semiconductor device in accordance with example embodiments of the inventive concept may include forming isolation regions 12 delimiting active regions 11 by performing a selective etch process, a deposition process, and an etch-back process. The forming the isolation regions 12 may include forming trenches 12t by selectively recessing a substrate 10, and partially filling the trenches 12t with trench insulators 12i. Non-recessed and protruding portions of the substrate 10 may become the active regions 11, and the trenches 12t and the trench insulators 12i may become isolation regions 12. The substrate 10 may include a wafer. For example, the substrate 10 may include one of a single crystalline silicon wafer, a silicon-on-insulator (SOI) wafer, a compound semiconductor wafer such as a SiGe wafer, and an epitaxial layer.

Figure 4A:
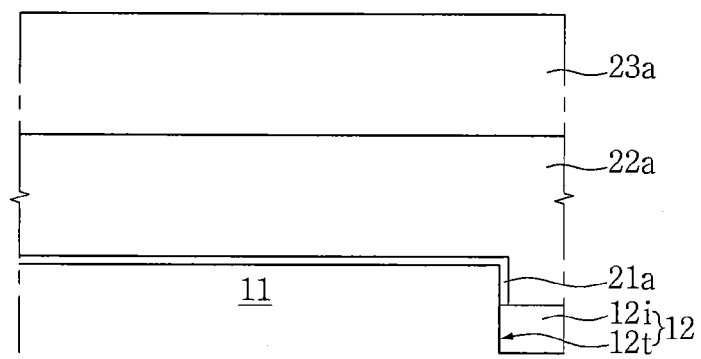
Figure 4B:
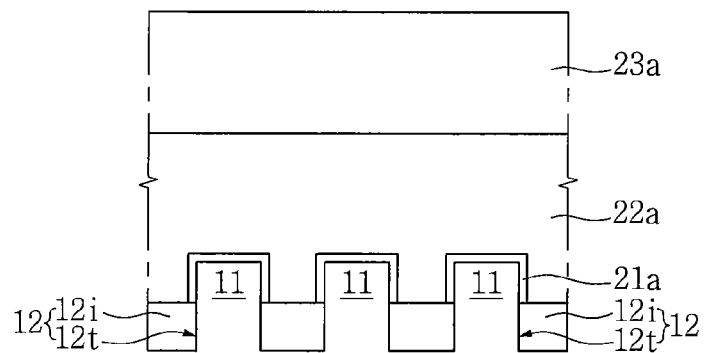

Referring to FIGS. 4A and 4B, the method may include forming surface insulating layers 21a on surfaces of the active regions 11 by performing an oxidation process, and entirely forming a sacrificial gate electrode layer 22a and a sacrificial gate capping layer 23a by performing a deposition process. The oxidation process may include oxidizing the surfaces of the active regions 11. Accordingly, the surface insulating layers 21a may include oxidized silicon layers. The sacrificial gate electrode layer 22a may include polysilicon. The sacrificial gate capping layer 23a may include silicon nitride. The sacrificial gate electrode layer 22a may cover the isolation regions 12 to completely fill the trenches 12t.

Figure 5A:
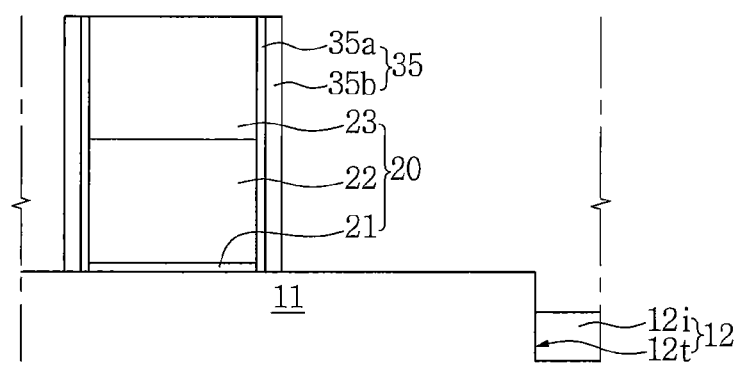
Figure 5B:
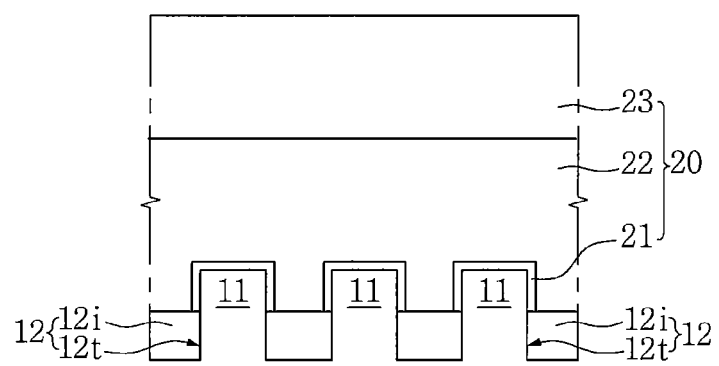
Figure 5C:
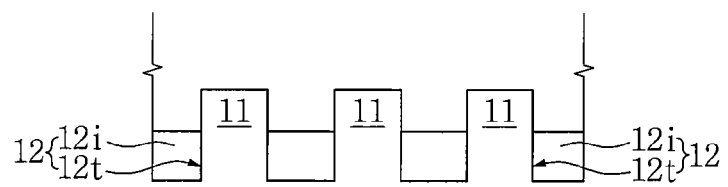

Referring to FIGS. 5A to 5C, the method may include forming a sacrificial gate pattern 20 by performing a patterning process, and forming gate spacers 35 on side surfaces of the sacrificial gate pattern 20 by performing a deposition process and an etch-back process. The sacrificial gate pattern 20 may include surface insulating patterns 21, a sacrificial gate electrode pattern 22, and a sacrificial gate capping pattern 23. The gate spacers 35 may include inner gate spacers 35a and outer gate spacers 35b. The inner gate spacers 35a may be conformally formed on side surfaces of the sacrificial gate pattern 20 and the upper surfaces of the active regions 11. The inner gate spacers 35a may include silicon oxide or silicon nitride. The outer gate spacers 35b may be formed on side surfaces of the inner gate spacers 35a. The outer gate spacers 35b may include silicon nitride or silicon oxide.

Figure 6A:
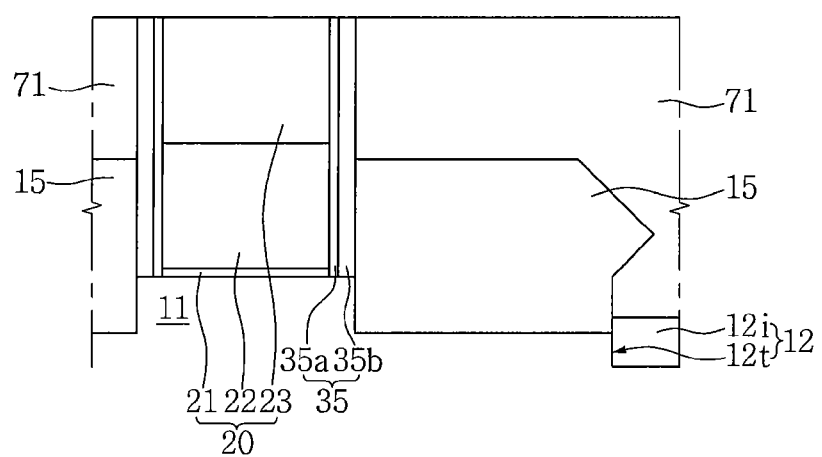
Figure 6B:
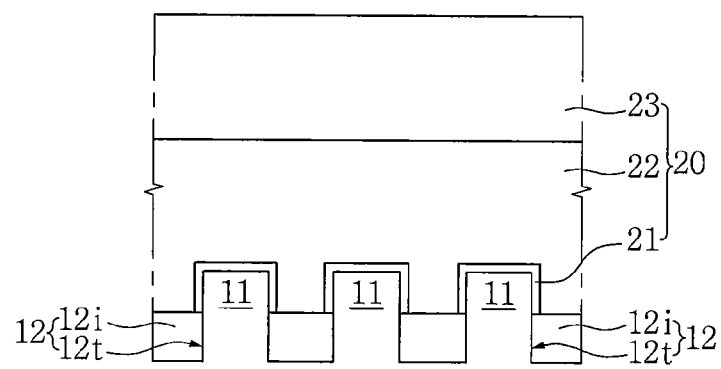
Figure 6C:
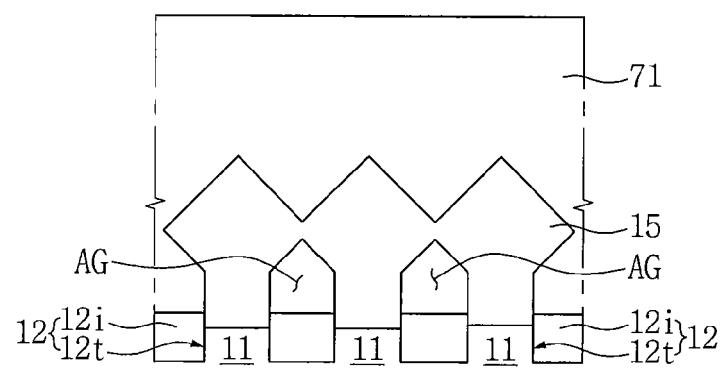

Referring to FIGS. 6A to 6C, the method may include recessing the exposed upper surfaces of the active regions 11 by performing an etch process and an epitaxial growth process, and forming source/drain regions 15 on the recessed surfaces of the active regions 11. A sectional view of the source/drain regions 15 may have a diamond shape or a rhombus shape. The source/drain regions 15 may be connected with each other as a bridge type to be physically continuous in a lateral direction. Accordingly, air gaps AG may be formed between the source/drain regions 15 and the active regions 11 and trench insulators 12i. The method may further include forming a first interlayer insulating layer 71 by performing a deposition process and exposing an upper surface of the sacrificial gate pattern 20 by performing a planarization process such as chemical mechanical polishing (CMP). For example, the upper surface of the sacrificial gate capping pattern 23 of the sacrificial gate pattern 20 may be exposed.

Figure 7A:
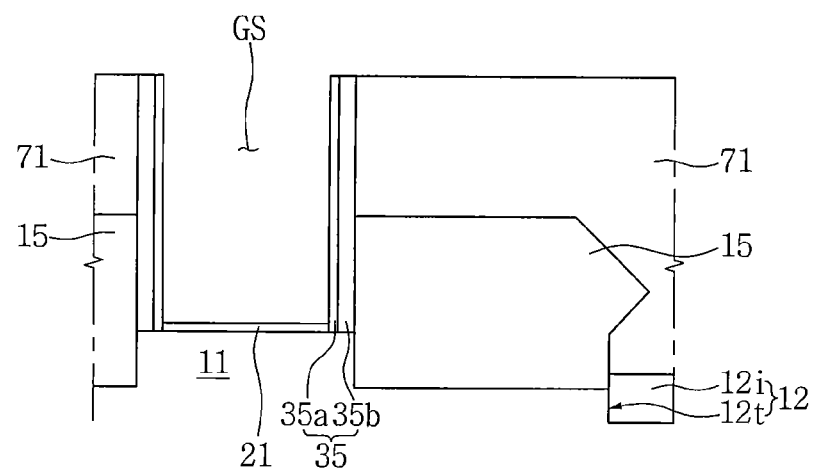
Figure 7B:
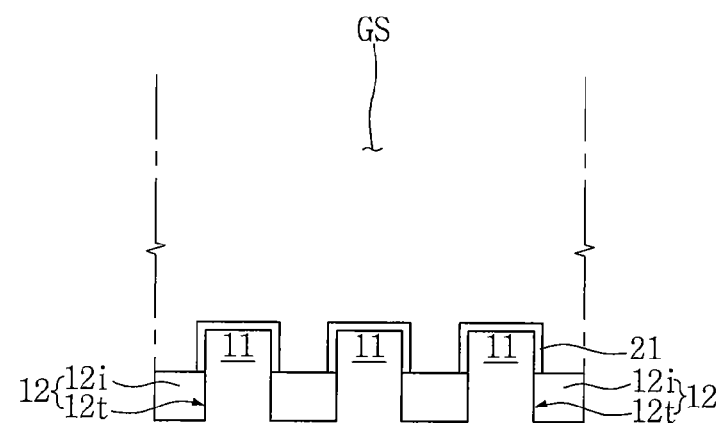
Figure 7C:
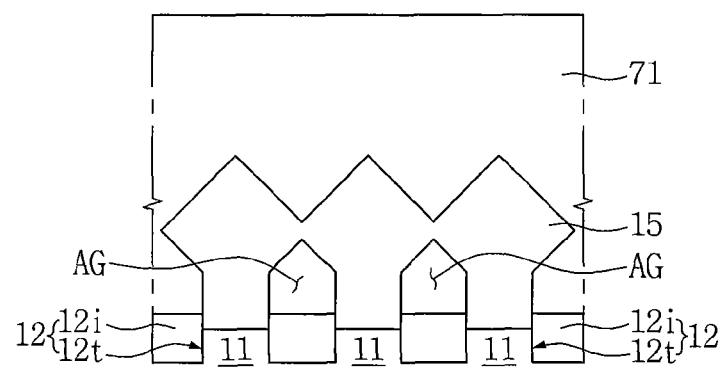

Referring to FIGS. 7A to 7C, the method may include forming a gate electrode space GS by removing the sacrificial gate capping pattern 23 and the sacrificial gate electrode pattern 22 through an etching process. The surface insulating patterns 21 may remain, or be re-formed after being removed. For example, after the surface insulating patterns 21 are removed, an oxidized silicon layer may be formed on the exposed active regions 11 by performing an oxidation process. The surface of the active regions 11 and the trench insulators 12i disposed under the sacrificial gate electrode pattern 22 may be exposed.

Figure 8A:
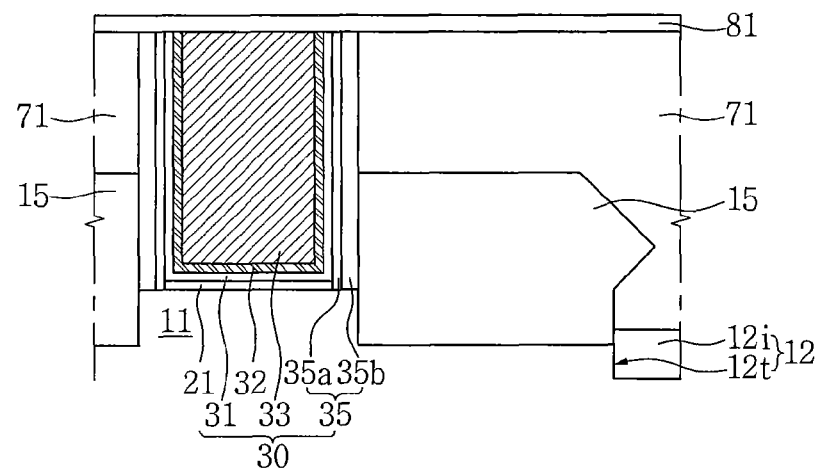
Figure 8B:
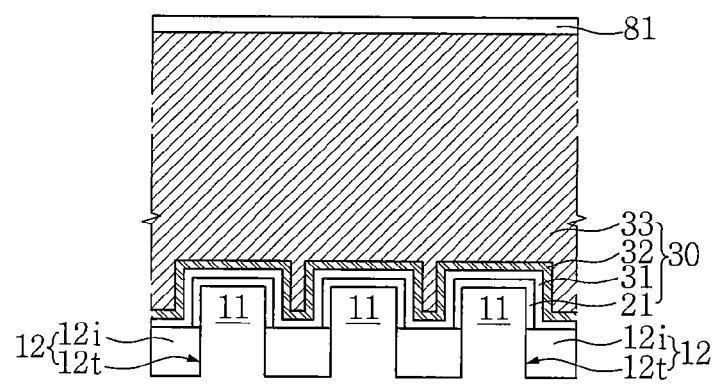
Figure 8C:

Referring to FIGS. 8A to 8C, the method may include forming a gate pattern 30 by performing a deposition process and a planarization process, and forming a first stopper layer 81 on the gate pattern 30 and the first interlayer insulating layer 71. The gate pattern 30 may include a gate insulating layer 31, a gate barrier layer 32, a gate electrode 33, and the gate spacers 35. The gate insulating layer 31 and the gate barrier layer 32 may be conformally formed on inner surfaces of the gate electrode space GS, on surfaces of the surface insulating patterns 21, and on the trench insulators 12i. The gate insulating layer 31 may include a high dielectric metal oxide layer such as HfO. The gate barrier layer 32 may include TiN or another barrier metal layer. The gate electrode 33 may include a multilayered metal compound layer. The gate electrode 33 may include a metal alloy and/or a metal compound including Ti, Al, Ta, and/or W. The first stopper layer 81 may include silicon nitride. In some embodiments, the first stopper layer 81 may be omitted.

Figure 9A:
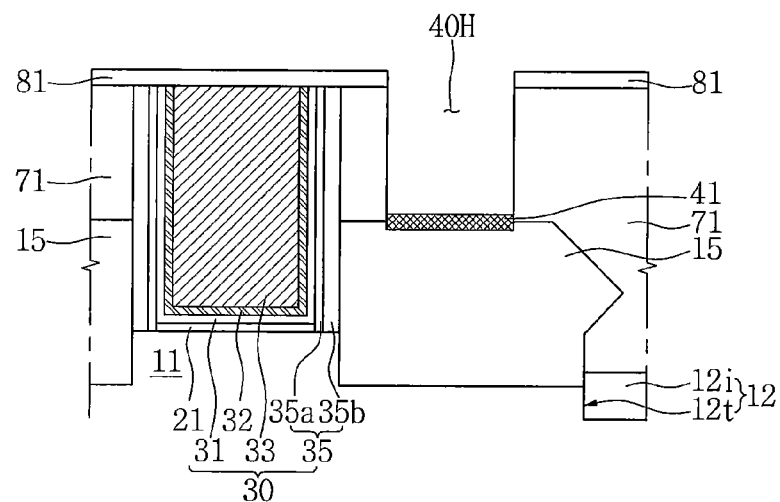
Figure 9B:
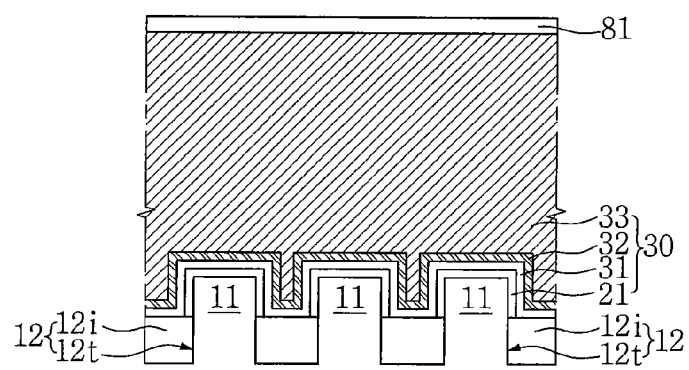
Figure 9C:
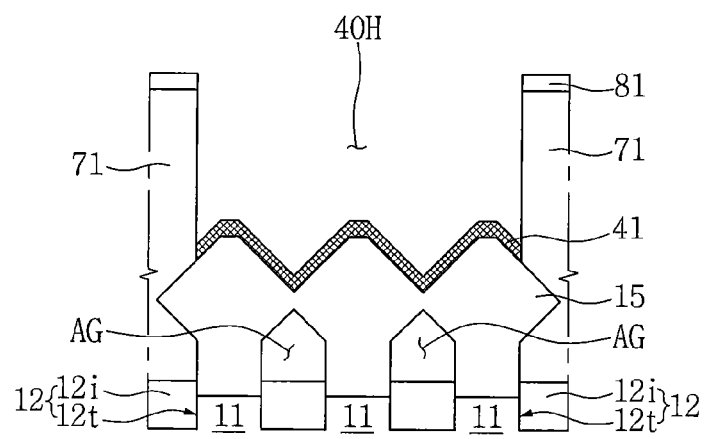

Referring to FIGS. 9A to 9C, the method may include forming a contact hole 40H exposing the source/drain regions 15 by performing an etching process, and forming a silicide layer 41 on the exposed surface of the source/drain regions 15. The silicide layer 41 may include a metal silicide, such as WSi, TiSi, CoSi, or NiSi.

Figure 10A:
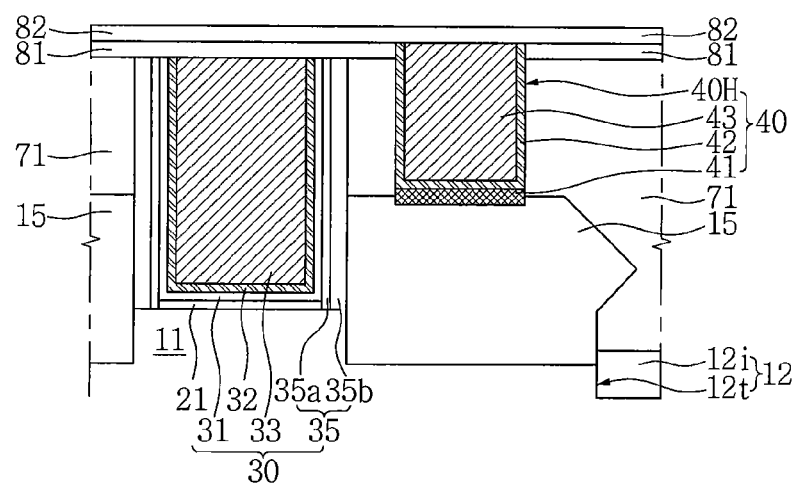
Figure 10B:
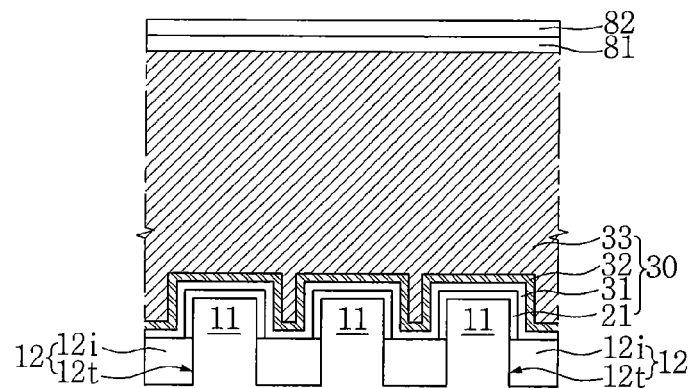
Figure 10C:
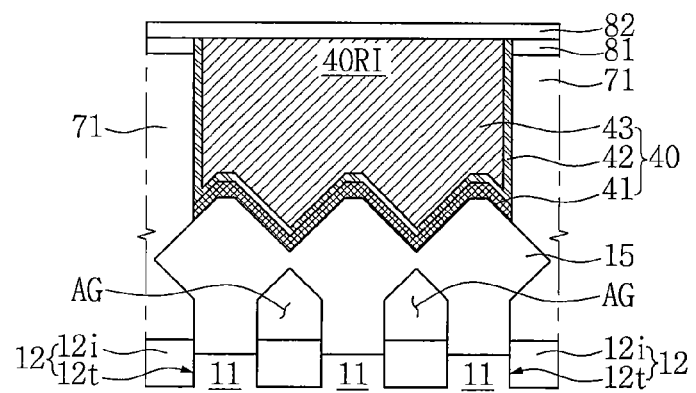
Figure 11A:
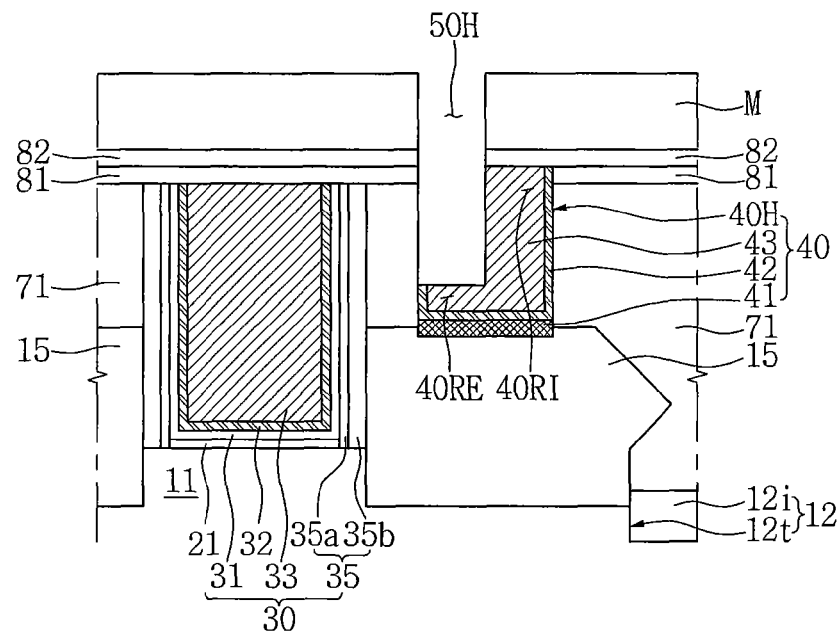
Figure 11B:
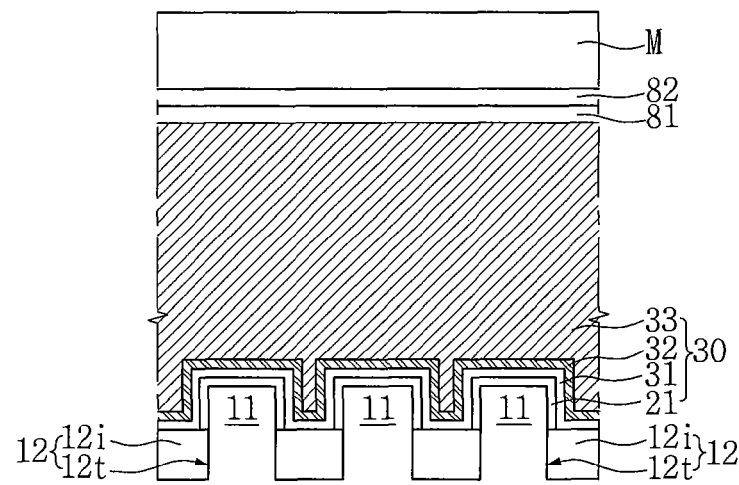
Figure 11C:
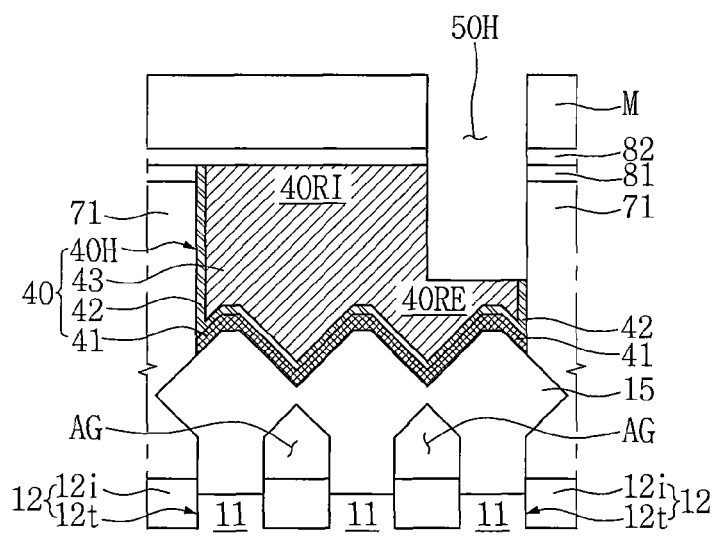
Figure 11D:
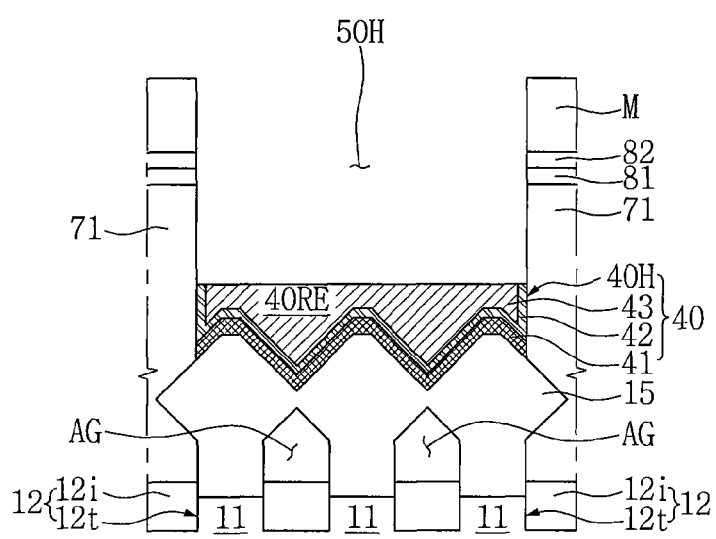
Figure 12A:
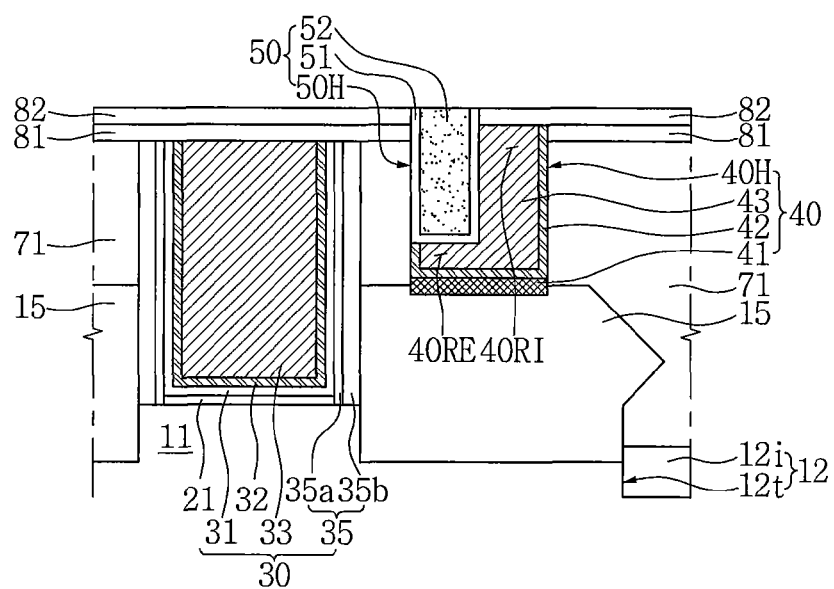
Figure 12B:
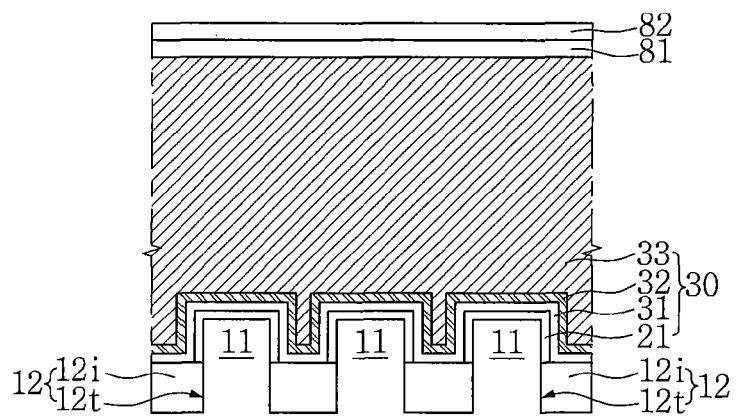
Figure 12C:
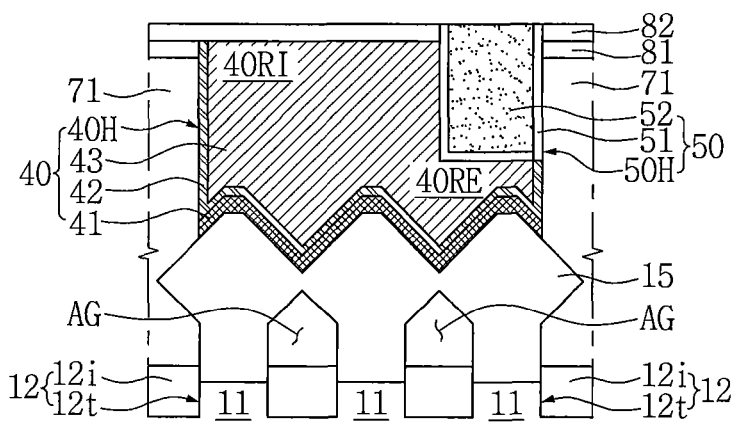
Figure 12D:
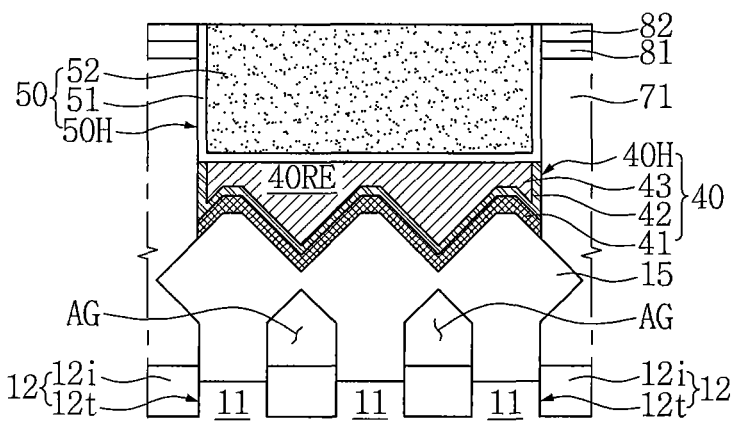
Figure 13A:
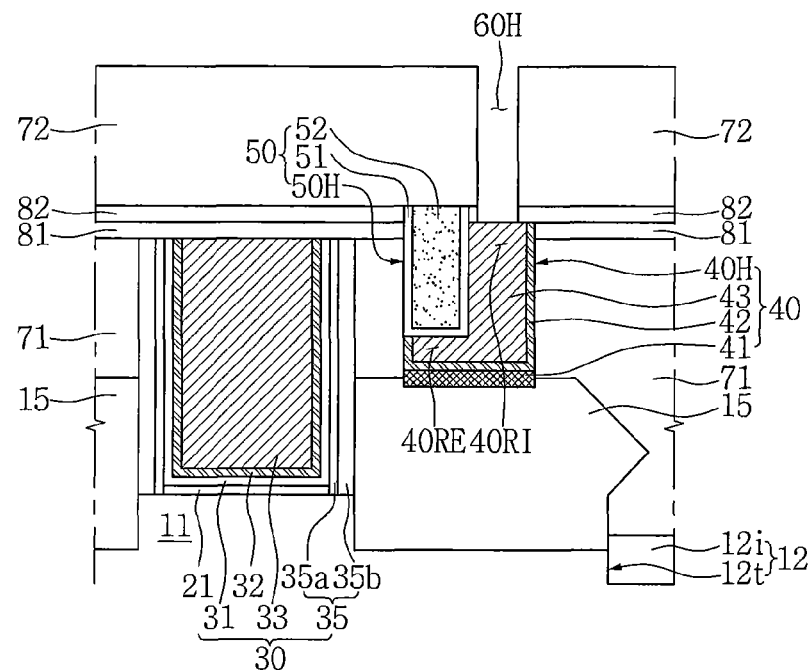
Figure 13B:
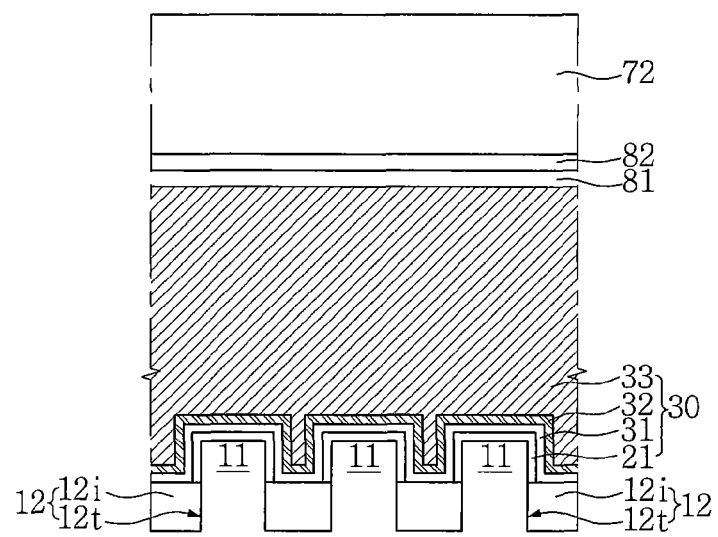
Figure 13C:
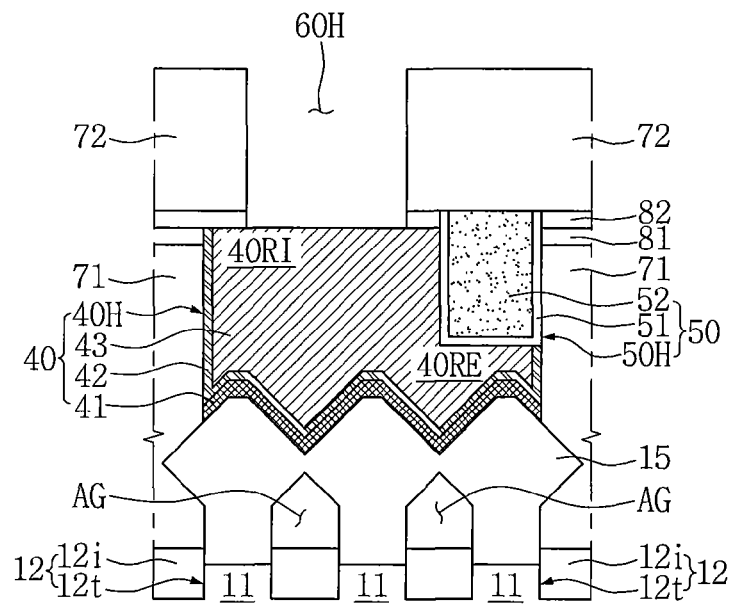
Figure 13D:
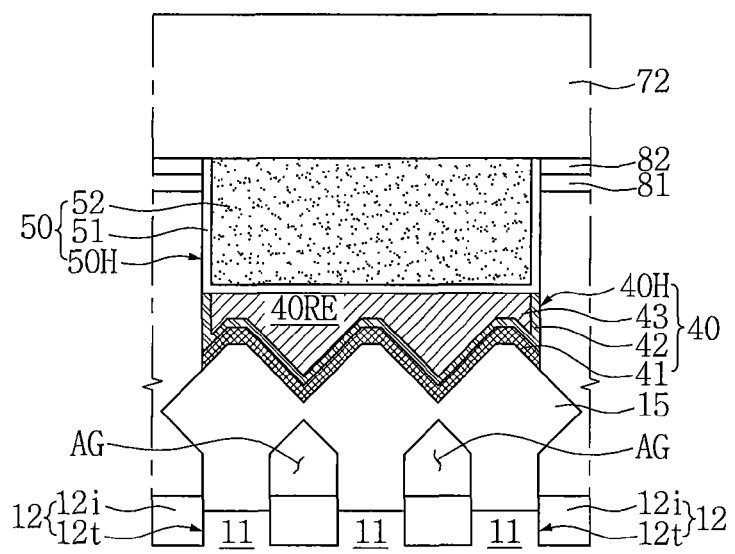
Figure 14A:
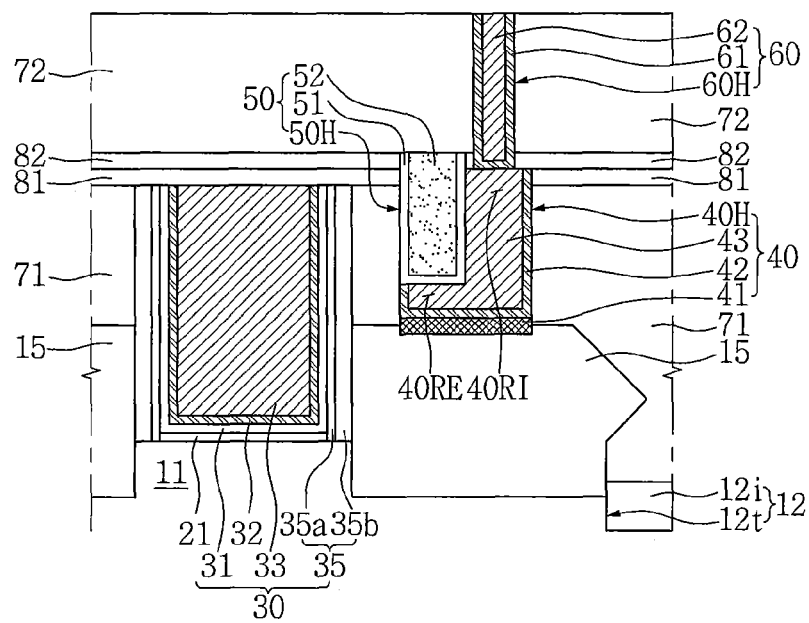
Figure 14B:
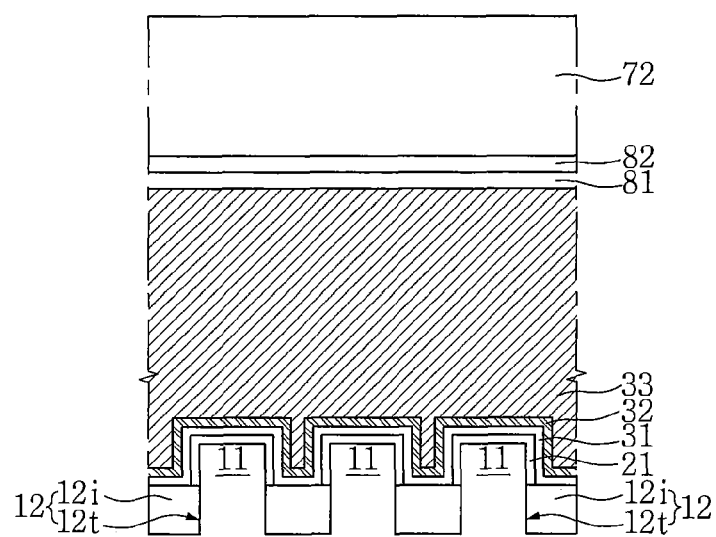
Figure 14C:
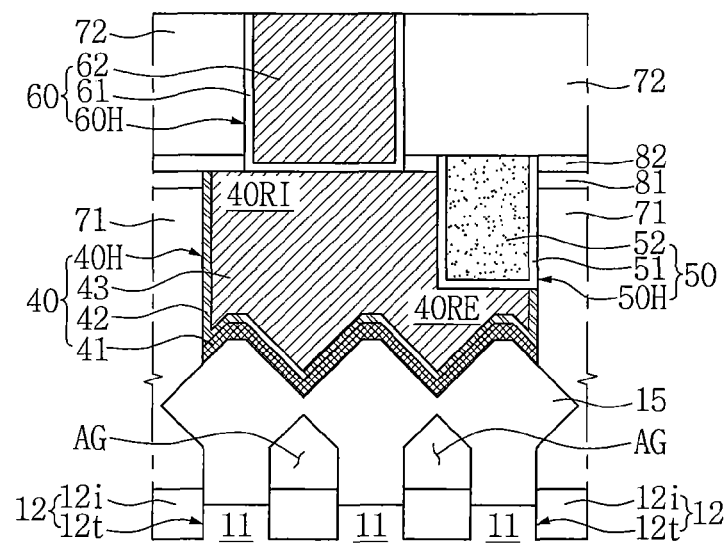
Figure 14D:
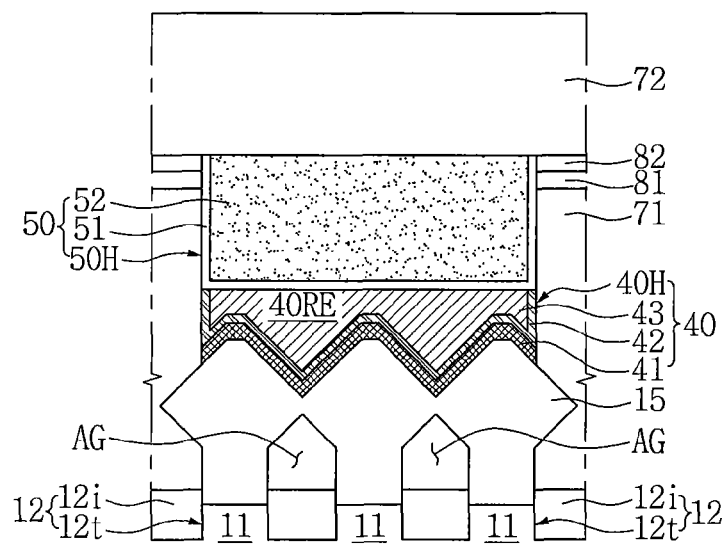

Referring to FIGS. 10A to 10C, the method may include forming a contact pattern 40 and forming a second stopper layer 82 on the contact pattern 40 and the first stopper layer 81. The forming the contact pattern 40 may include conformally forming a contact barrier layer 42 on an upper surface of the silicide layer 41a and inner walls of the contact hole 40H, and forming a contact plug 43 filling the contact hole 40H on the contact barrier layer 42. The method may include performing a planarization process such as CMP such that upper surfaces of the contact barrier layer 42 and the contact plug 43 are coplanar with an upper surface of the first stopper layer 81. The contact barrier layer 42 may include TiN or another barrier metal layer. The contact plug 43 may include a metal such as W. The second stopper layer 82 may include silicon nitride. In some embodiments, the second stopper layer 82 may be omitted.

Referring to FIGS. 11A to 11D, the method may include forming a mask pattern M vertically aligned with and overlapping a portion of the contact pattern 40, and forming an insulating hole 50H by partially removing the second stopper layer 82, the contact plug 43, and the contact barrier layer 42 through an etching process using the mask pattern M as an etching mask. In some embodiments, the surfaces of the silicide layer 41 or the source/drain regions 15 in the insulating hole 50H may be exposed. The mask pattern M may include one of photoresist, polysilicon, or spin-on-hardmask (SOH). Sequentially, the mask pattern M may be removed.

Referring to FIGS. 12A to 12D, the method may include forming an insulating pattern 50. The forming the insulating pattern 50 may include conformally forming a blocking layer 51 on inner walls of the insulating hole 50H, the contact plug 43 and contact barrier layer 42 exposed in the insulating hole 50H, and second stopper layer 82 by performing a deposition process, forming a filling layer 52 filling the insulating hole 50H, and removing the filling layer 52 and the blocking layer 51 disposed on the second stopper layer 82 by performing a planarization process such as CMP. The blocking layer 51 may include silicon nitride. The filling layer 52 may include silicon oxide. The blocking layer 51 and the filling layer 52 may include an insulating material.

Referring to FIGS. 13A to 13D, the method may include entirely forming a second interlayer insulating layer 72 by performing a deposition process, and forming a via hole 60H vertically passing through the second interlayer insulating layer 72 to expose an upper surface of the contact plug 43. The second interlayer insulating layer 72 may include silicon oxide.

Referring to FIGS. 14A to 14D, the method may include forming a via pattern 60. The forming the via pattern 60 may include conformally forming a via barrier layer 61 on the upper surface of the contact plug 43 exposed in the via hole 60H and inner walls of the via hole 60H, and forming a via plug 62 on the via barrier layer 61 to fill the via hole 60H. The via barrier layer 61 may include TiN or another barrier metal layer. The via plug 62 may include a metal such as W. The method may further include performing a planarization process such as CMP to planarize upper surfaces of the via plug 62, the via barrier layer 61, and the second interlayer insulating layer 72.

Sequentially, referring FIGS. 2A to 2D, the method may include forming an interconnection 65 horizontally extending on the via plug 62 and forming a third interlayer insulating layer 73 covering the interconnection 65. The interconnection 65 may include a metal. The third interlayer insulating layer 73 may include silicon oxide.

Figure 15:
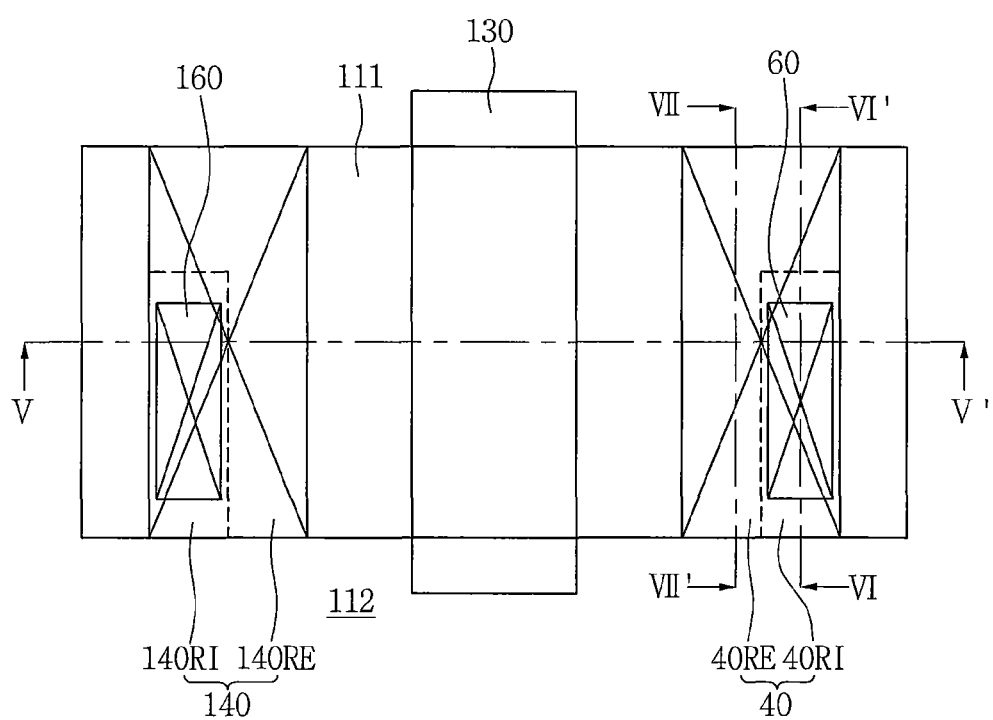
FIG. 15 is a layout of a semiconductor device in accordance with example embodiments of the inventive concept.

FIG. 15 is a layout of a semiconductor device in accordance with example embodiments of the inventive concept. Referring to FIG. 15, a semiconductor device in accordance with example embodiments of the inventive concept may include an active region 111, an isolation regions 112 surrounding the active region 111, a gate pattern 130 crossing the active region 111, contact patterns 140 overlapping the active region 111, and via patterns 160 overlapping the contact patterns 140. The active regions 111 may be a plurality of bars that are in parallel with each other. Each of the contact patterns 140 may include recessed portion 140RE near to the gate pattern 130, and rising portion 140RI away from the gate pattern 130. The contact patterns 140 may be disposed in both side directions of the gate pattern 130 to have mirrored shapes. The contact patterns 140 may not be arranged in a horizontal direction (perpendicular to the gate pattern 130). The via patterns 160 may overlap the rising portions 140RI of the contact patterns 140. Each of the via patterns 160 may be divided into a plurality of via patterns.

Figure 16A:
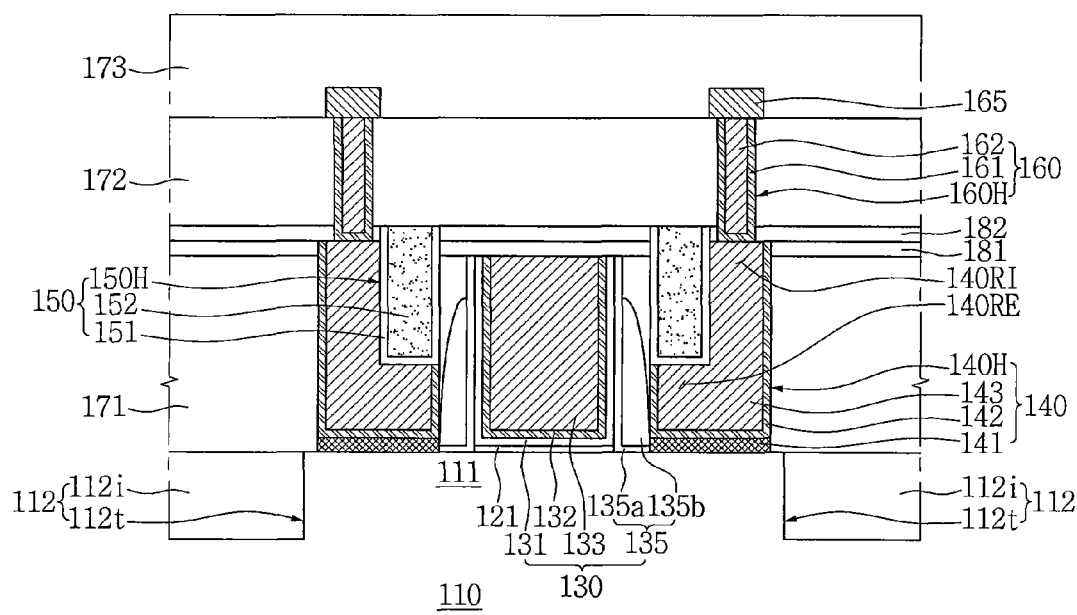
FIGS. 16A to 16C are cross-sectional views of a semiconductor device in accordance with example embodiments of the inventive concept, taken along the lines V-V', VI-VI', and VII-VII' of FIG. 15.
Figure 16B:
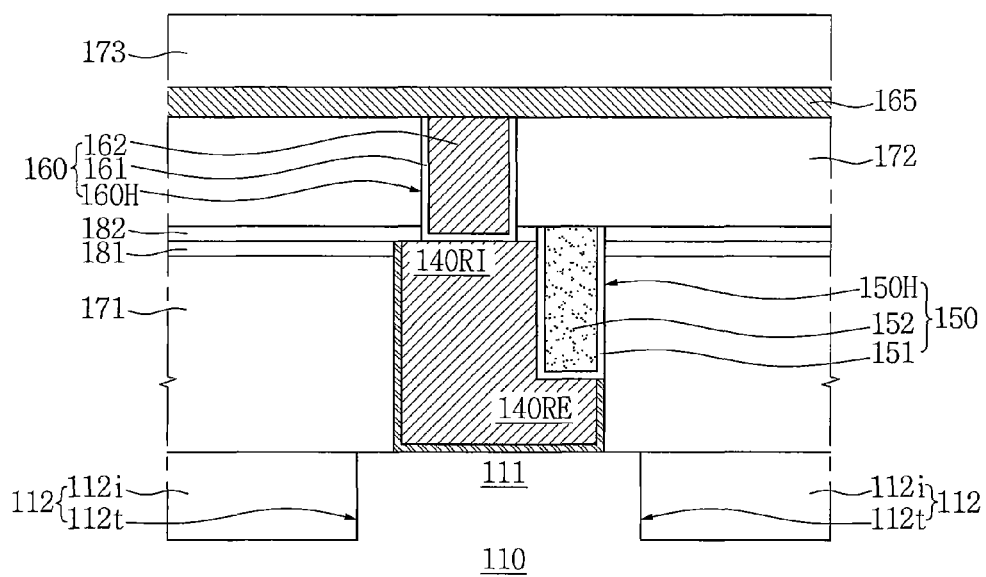
Figure 16C:
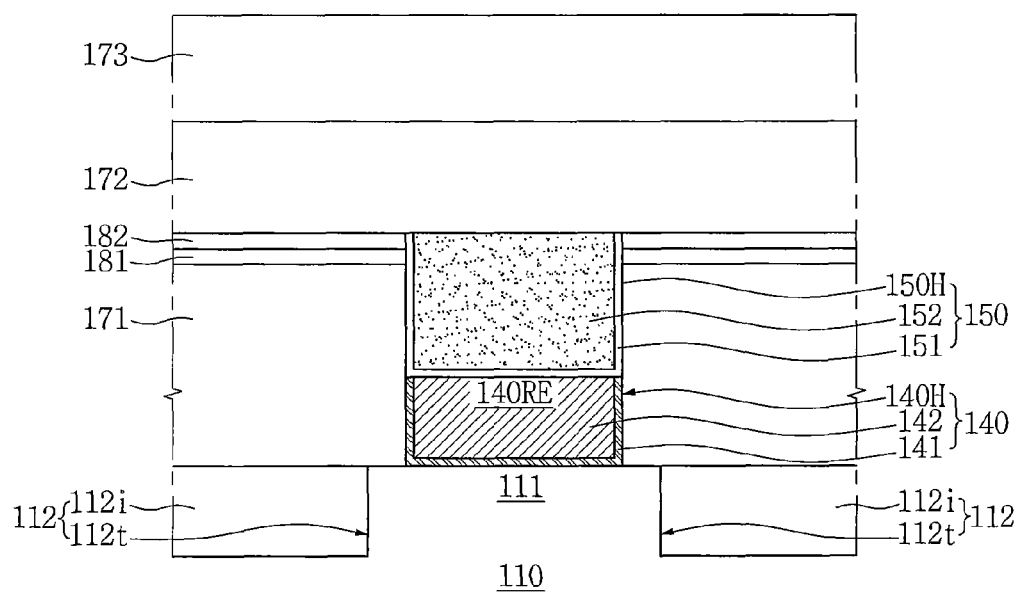

FIGS. 16A to 16C are cross-sectional views of a semiconductor device in accordance with example embodiments of the inventive concept, taken along the lines V-V', VI-VI', and VII-VII' of FIG. 15.

Referring to FIGS. 16A and 16C, a semiconductor device in accordance with example embodiments of the inventive concept may include a substrate 110 including an active region 111 and isolation regions 112, a gate pattern 130, contact patterns 140, insulating patterns 150, and via patterns 160, which are disposed on the active region 111.

The substrate 110 may include a silicon wafer. The active region 111 may be a dopant-doped portion of the substrate 110. The isolation regions 112 may include trench insulators 112i filling trenches 112t. The isolation regions 112 may surround and delimit the active region 111.

The gate pattern 130 may include a gate insulating layer 131, a gate barrier pattern 132, a gate electrode 133, and gate spacers 135. The gate pattern 130 may further include a surface insulating pattern 121 disposed between the active region 111 and the gate insulating layer 131. The gate spacers 135 may include inner gate spacers 135a and outer gate spacers 135b.

The surface insulating pattern 121 may include an oxidized silicon layer formed by oxidizing a surface of the active region 111. The surface insulating pattern 121 may be formed on the exposed surface of the active region 111.

The gate insulating layer 131 may be conformally formed on inner walls of the surface insulating pattern 121 and the inner gate spacers 135a. For example, the gate insulating layer 131 may have a U-shaped cross-section. The gate insulating layer 131 may include a metal oxide layer, such as HfO or AlO.

The gate barrier pattern 132 may be conformally formed on the gate insulating layer 131. For example, the gate barrier pattern 132 may have a U-shaped cross-section. The gate barrier pattern 132 may include TiN or another barrier metal layer.

The gate electrode 133 may have a solid shape cross-section surrounded by the gate barrier pattern 132. The gate electrode 133 may include a metal such as W.

The inner gate spacers 135a and the outer gate spacers 135b may be formed on outer walls of the gate insulating layer 131. The inner gate spacers 135a may extend on a portion of the surface of the active region 111. The inner gate spacers 135a may include silicon oxide. The outer gate spacers 135b may include silicon nitride.

The inner gate spacers 135a may be coplanar with the gate insulating layer 131. An uppermost portion of the outer gate spacers 135b may be disposed at a lower level than an uppermost portion of the inner gate spacers 135a from the substrate 110.

The semiconductor device may further include a first interlayer insulating layer 171 surrounding side surfaces of the gate pattern 130 on the active region 111 and the isolation regions 112. An upper surface of the first interlayer insulating layer 171 may be coplanar with an upper surface of the gate pattern 130.

The semiconductor device may further include a first stopper layer 181 formed flat on the first interlayer insulating layer 171. The first stopper layer 181 may include silicon nitride.

The contact patterns 140 may vertically pass through the first stopper layer 181 and the first interlayer insulating layer 171 to be connected with the active region 111. The contact patterns 140 may include silicide layers 141, contact barrier layers 142, and contact plugs 143. The silicide layers 141 may be directly formed on the surface of the active region 111. The silicide layers 141 may include a metal silicide, such as WSi, TiSi, CoSi, or NiSi. The contact barrier layers 142 may be conformally formed on the silicide layers 141 and inner walls of contact holes 140H. The contact barrier layers 142 may include TiN or another barrier metal layer. The contact plugs 143 may be formed to fill the contact holes 140H on the contact barrier layers 142. The contact plugs 143 may include a metal such as W.

The contact patterns 140 may include relatively higher rising portions 140RI and relatively lower recessed portions 140RE. Upper surfaces of the rising portions 140RI may be coplanar with an upper surface of the first stopper layer 181. The upper surfaces of the rising portions 140RI may be disposed at a higher level than an upper surface of the gate electrode 133 of the gate pattern 130 from the substrate 110. Upper surfaces of the recessed portions 140RE may be disposed at a lower level than the upper surface of the gate electrode 133 of the gate pattern 130 from the substrate 110. The contact patterns 140 may have L-shaped cross-sections in a first sectional view (a cross-sectional view), and I-shaped or l-shaped cross-sections in second sectional view.

The contact patterns 140 may be line-symmetrically disposed in both side directions of the gate pattern 130 to have mirrored shapes.

The semiconductor device may further include a second stopper layer 182 formed flat on the first stopper layer 181 and the contact patterns 140. The second stopper layer 182 may include silicon nitride.

The insulating patterns 150 may be formed on the recessed portions 140RE of the contact patterns 140 to vertically pass through the second stopper layer 182 and the first stopper layer 181. The insulating patterns 150 may include blocking layers 151 conformally formed on surfaces of recessed portions 140RE of the contact patterns 140 exposed in insulating holes 150H and on inner walls of the insulating holes 150H, and filling layers 152 filling the insulating holes 150H on the blocking layers 151. Upper surfaces of the insulating patterns 150 may be coplanar with an upper surface of the second stopper layer 182. The blocking layers 151 may include silicon nitride, and the filling layers 152 may include silicon oxide or silicon nitride. For example, the blocking layers 151 and the filling layers 152 maybe formed of a single material layer including the same material.

The semiconductor device may further include a second interlayer insulating layer 172 on the second stopper layer 182 and the insulating patterns 150. The second interlayer insulating layer 172 may include silicon oxide.

The via patterns 160 may vertically pass through the second interlayer insulating layer 172 and the second stopper layer 182, and may be vertically aligned with the rising portions 140RI of the contact patterns 140 and overlap the rising portions 140RI of the contact patterns 140. Accordingly, the via patterns 160 may be electrically connected with the contact patterns 140. The via patterns 160 may include via barrier layers 161 conformally formed on surfaces of rising portions 140RI of the contact patterns 140 in via holes 160H and inner walls of the via holes 160H, and via plugs 162 filling the via holes 160H on the via barrier layers 161. The via barrier layers 161 may include TiN or other barrier metal layers. The via plugs 162 may include a metal such as W.

The semiconductor device may further include interconnections 165 vertically overlapping the via patterns 160 on the second interlayer insulating layer 172. The interconnections 165 may include a metal such as W.

The semiconductor device may further include a third interlayer insulating layer 173 covering the interconnections 165 on the second interlayer insulating layer 172. The third interlayer insulating layer 173 may include silicon oxide.

Figure 16D:
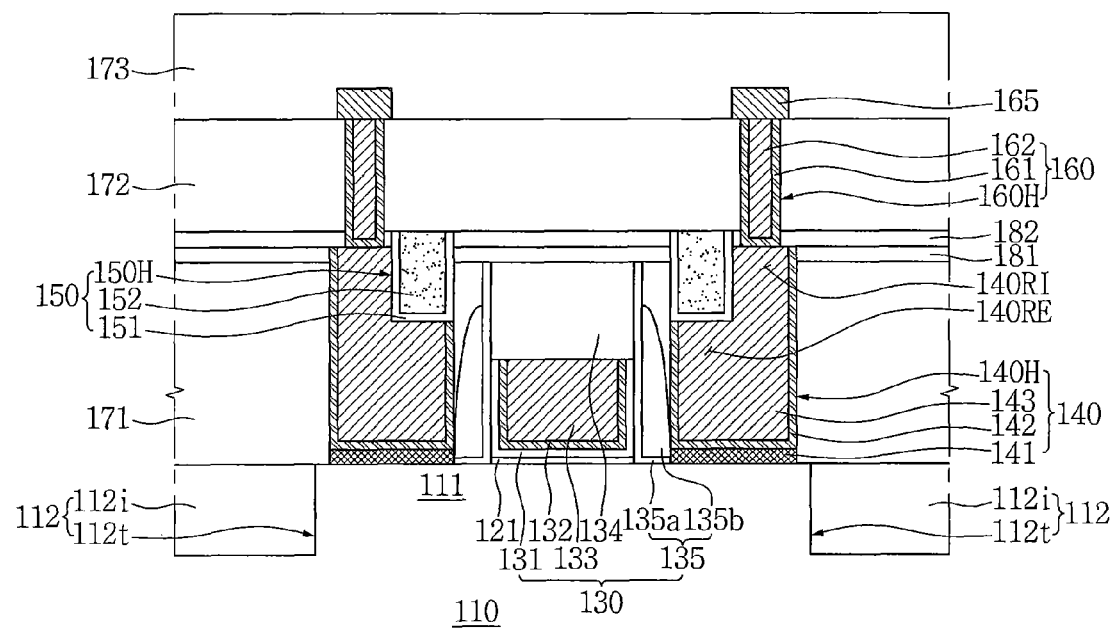
FIG. 16D is a cross-sectional view of a semiconductor device in accordance with example embodiments of the inventive concept, taken along the line V-V' of FIG. 15.

FIG. 16D is a cross-sectional view of a semiconductor device in accordance with example embodiments of the inventive concept, taken along the line V-V' of FIG. 15. Referring to FIG. 16D, a gate pattern 130 of a semiconductor device in accordance with example embodiments of the inventive concept may further include a gate capping layer 134. The gate capping layer 134 may be disposed on the gate insulating layer 131, the gate barrier layer 132, and the gate electrode 133.

Upper surfaces of recessed portions 140RE of contact patterns 140 may be disposed at a higher level than an upper surface of the gate electrode 133 from the substrate 110.

Figure 22A:
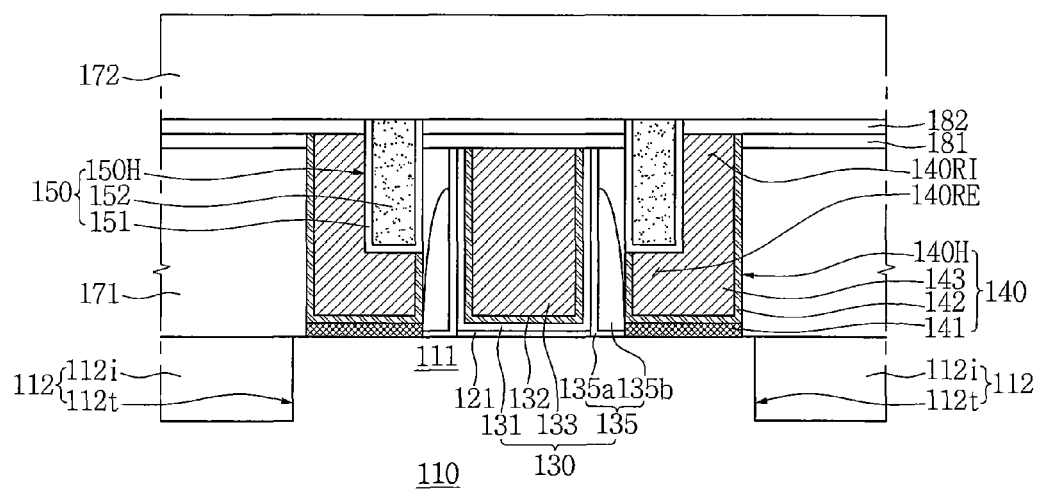
Figure 22B:
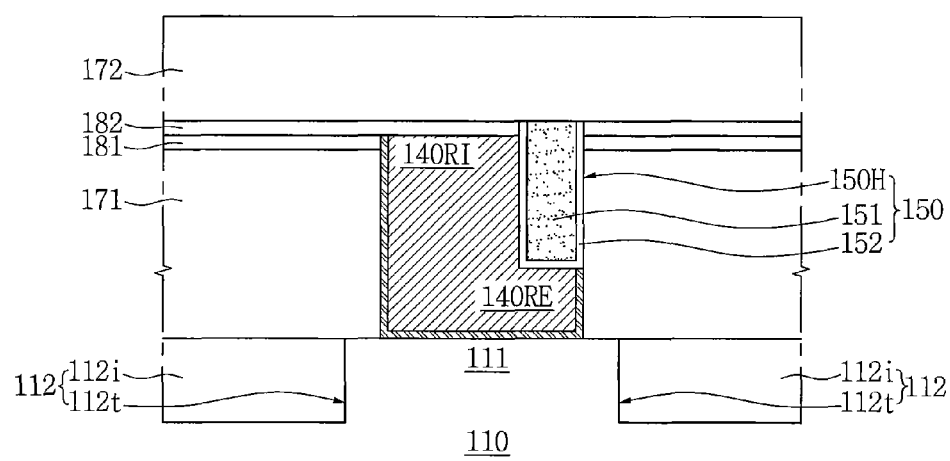
Figure 22C:
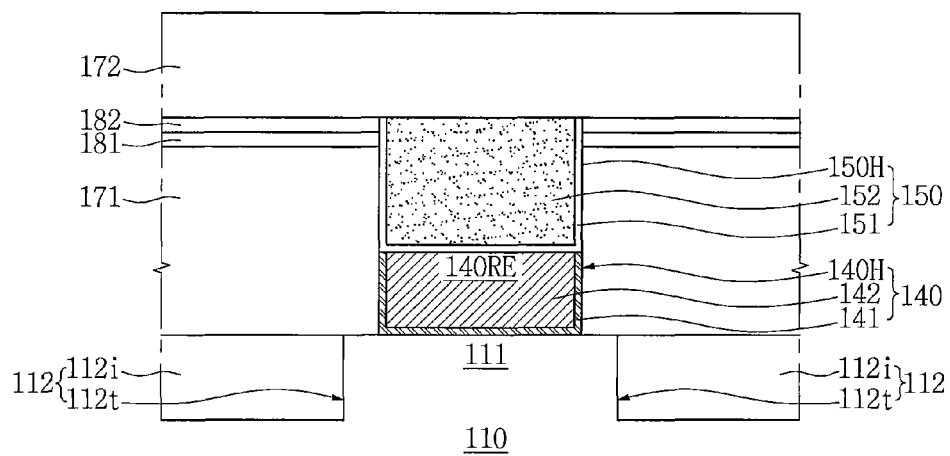
Figure 23A:
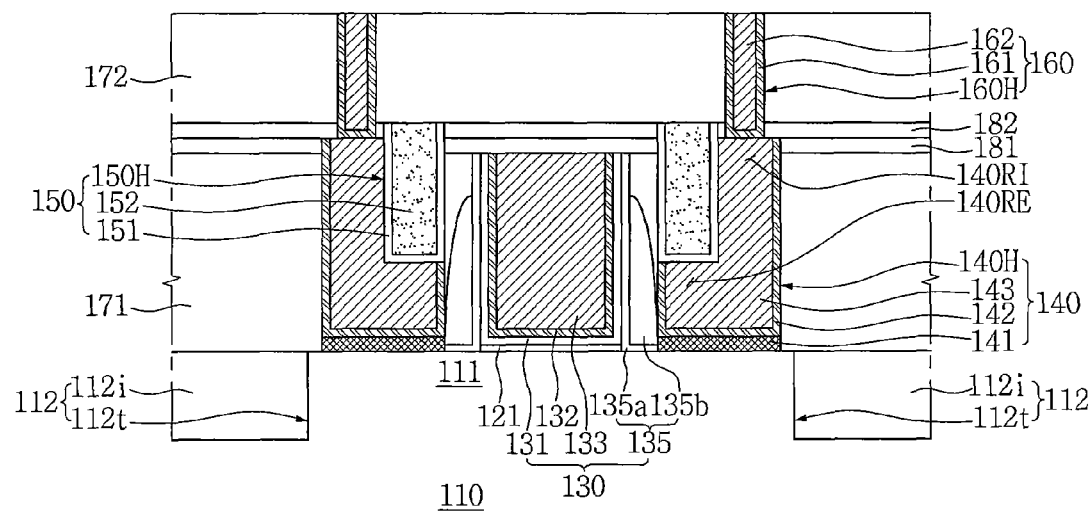
Figure 23B:
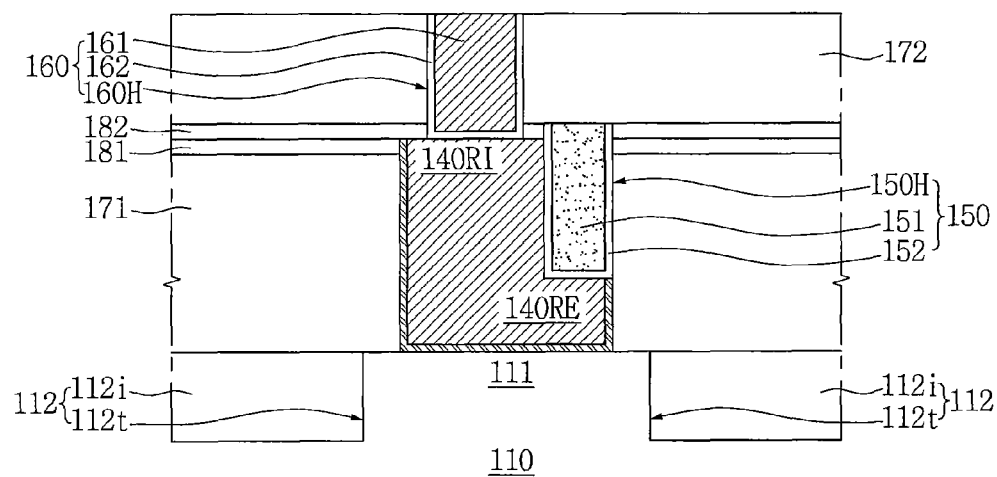
Figure 23C:
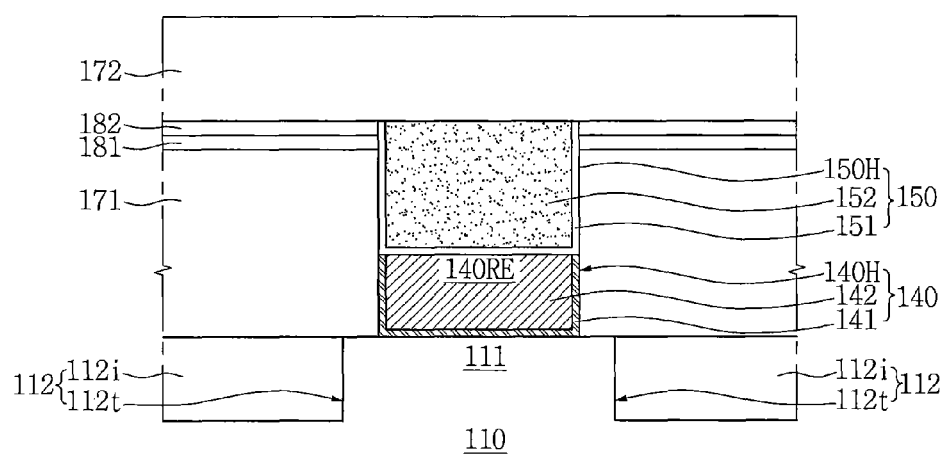

FIGS. 17 to 23C are cross-sectional views for describing a method of fabricating a semiconductor device in accordance with example embodiments of the inventive concept. FIGS. 17 to 20 and FIGS. 21A to 23A are cross-sectional views taken along the line V-V' of FIG. 15, FIGS. 21B to 23B are cross-sectional views taken along the line VI-VP of FIG. 15, and FIGS. 21C and 23C are cross-sectional views taken along the line VII-VII' of FIG. 15.

Figure 17:
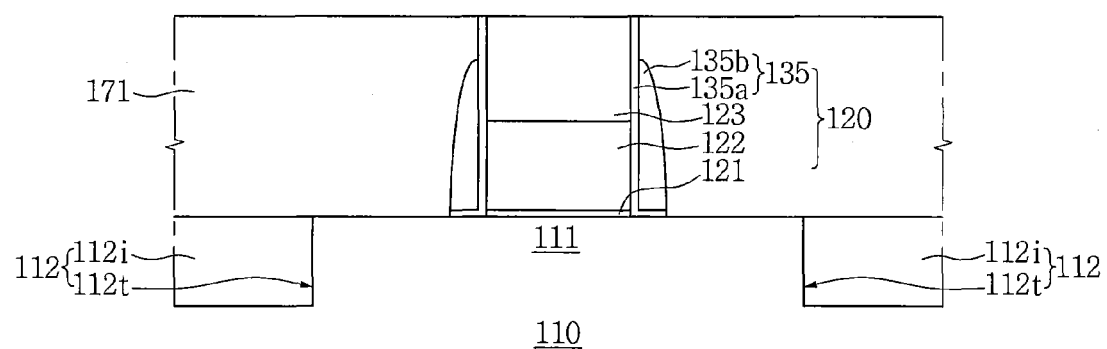

Referring to FIG. 17, a method of fabricating a semiconductor device in accordance with example embodiments of the inventive concept may include forming isolation regions 112 delimiting an active region 111 on a substrate 110 and forming a sacrificial gate pattern 120 on the active region 111. The sacrificial gate pattern 120 may include a surface insulating pattern 121, a sacrificial gate electrode 122, a sacrificial gate capping pattern 123, and gate spacers 135. The substrate 110 may include a silicon wafer. The isolation regions 112 may include trench insulators 112*i* filling trenches 112*t*.

The surface insulating pattern 121 may include an oxidized silicon layer formed by oxidizing a surface of the active region 111. The sacrificial gate electrode 122 may include polysilicon. The sacrificial gate capping pattern 123 may include silicon nitride. The gate spacers 135 may include inner gate spacers 135*a* and outer gate spacers 135*b*. The inner gate spacers 135*a* may be conformally formed on a portion of the surface of the active region 111 and side surfaces of the sacrificial gate electrode 122. The inner gate spacers 135*a* may include silicon oxide. The outer gate spacers 135*b* may be formed on side surfaces of the inner gate spacers 135*a*. Upper ends of the outer gate spacers 135*b* may be lower than upper ends of the inner gate spacers 135*a* and upper surfaces of the sacrificial gate capping pattern 123 from the substrate 110. The outer gate spacers 135*b* may include silicon nitride.

The method may include forming a first interlayer insulating layer 171 surrounding side surfaces of the sacrificial gate pattern 120 by performing a deposition process and a planarization process. The first interlayer insulating layer 171 may be coplanar with the sacrificial gate capping pattern 123 and the inner gate spacers 135*a*. The first interlayer insulating layer 171 may include silicon oxide.

Figure 18:
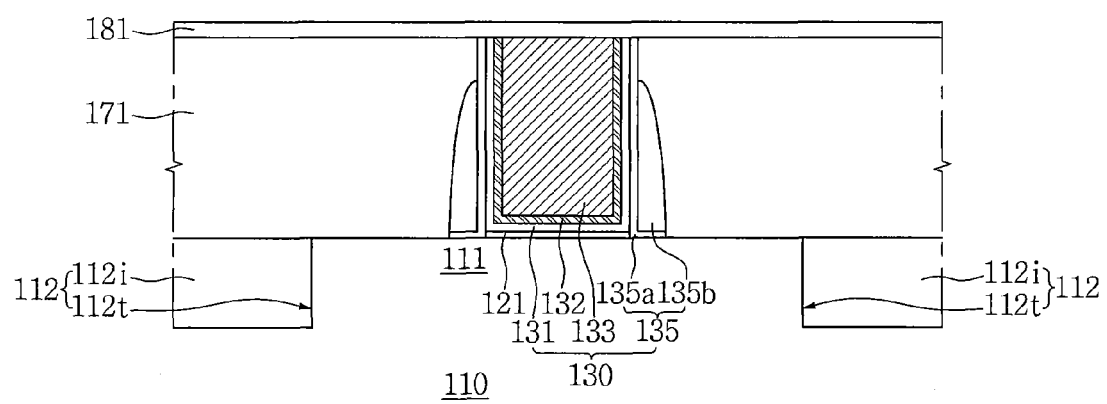

Referring to FIG. 18, the method may include forming a gate pattern 130 and forming a first stopper layer 181 on the first interlayer insulating layer 171 and the gate pattern 130. The forming the gate pattern 130 may include forming a space by removing the sacrificial gate capping pattern 123 and the sacrificial gate electrode 122 by performing an etch process, conformally forming a gate insulating layer 131 on the surface insulating pattern 121 and inner walls of the inner gate spacers 135*a* in the space by performing a deposition process and a planarization process, conformally forming a gate barrier layer 132 on the gate insulating layer 131, forming a gate electrode 133 filling the space on the gate barrier layer 132, and performing a planarization process.

The gate insulating layer 131 may include a metal oxide such as HfO. The gate barrier layer 132 may include TiN or another barrier metal layer. The gate electrode 133 may include a multilayered metal compound layer. The gate electrode 133 may include a metal alloy and/or a metal compound including Ti, Al, Ta, and/or W. The first stopper layer 181 may include silicon nitride.

Figure 19:
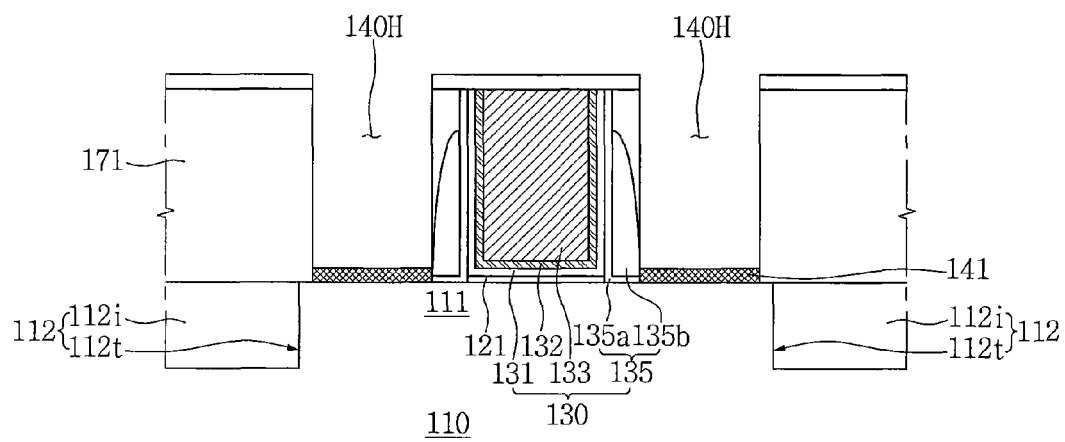

Referring to FIG. 19, the method may include forming contact holes 140H vertically passing through the first stopper layer 181 and the first interlayer insulating layer 171 to expose the surface of the active region 111 by performing a photolithography process and an etch process, and forming silicide layers 141 on the exposed surface of the active region 111. The silicide layers 141 may include a metal silicide, such as WSi, TiSi, CoSi, or NiSi.

Figure 20:
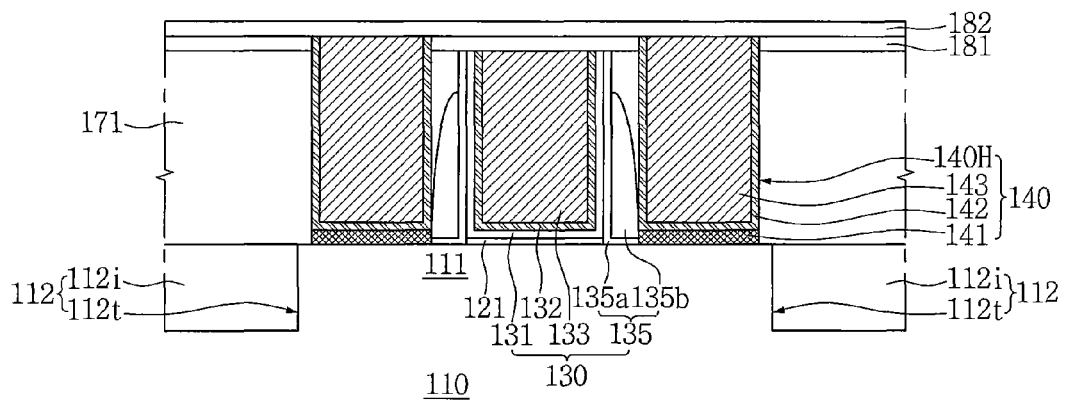

Referring to FIG. 20, the method may include forming contact patterns 140 by performing a deposition process and a planarization process and forming a second stopper layer 182 on the contact patterns 140 and the first stopper layer 181. The contact patterns 140 may include contact barrier layers 142 conformally formed on the silicide layers 141 and inner walls of the contact holes 140H in the contact holes 140H, and contact plugs 143 filling the contact holes 140H on the contact barrier layers 142. The contact barrier layers 142 may include TiN or other barrier metal layers. The contact plugs 143 may include a metal such as W. The second stopper layer 182 may include silicon nitride.

Figure 21A:
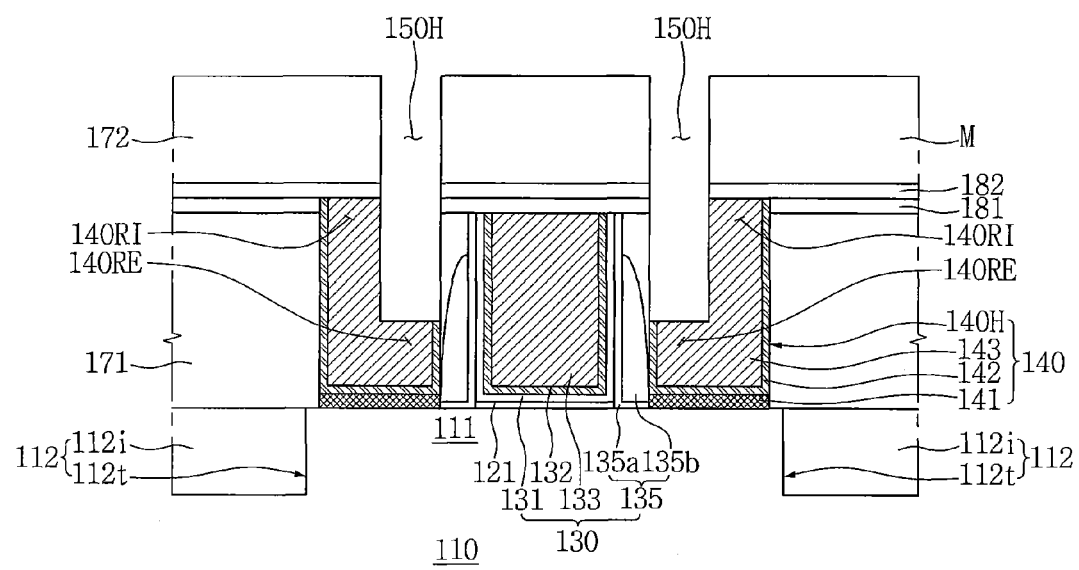
Figure 21B:
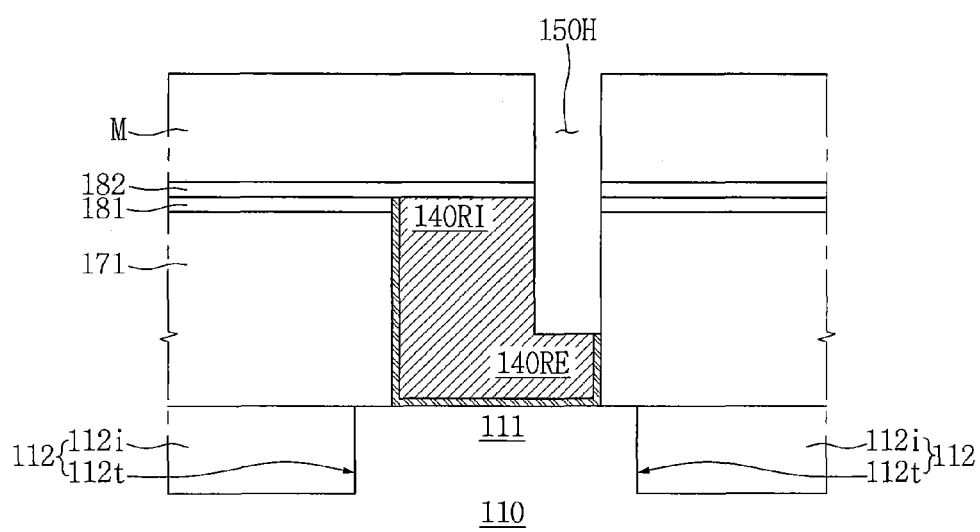
Figure 21C:
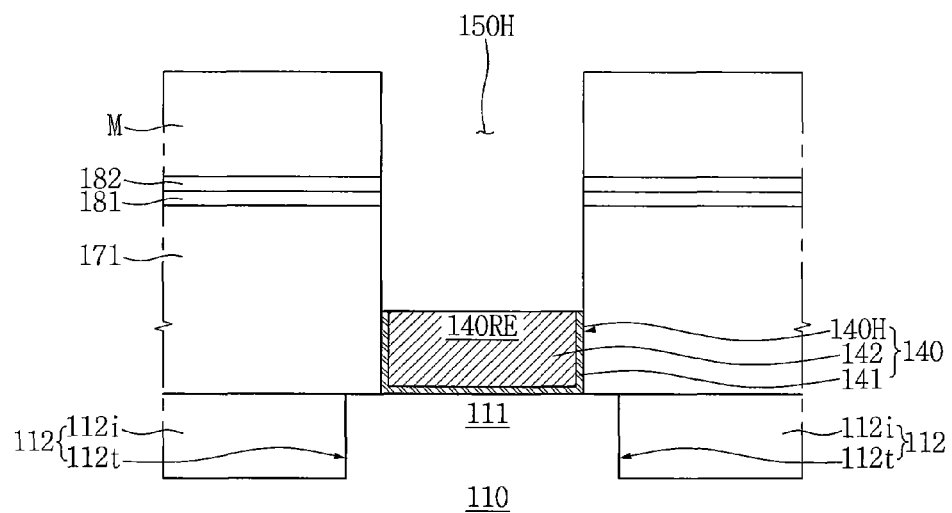

Referring to FIGS. 21A to 21C, the method may include forming a mask pattern M vertically aligned with and overlapping the contact plugs 143 and a portion of the contact barrier layers 142 and forming insulating holes 150H by partially removing the contact plugs 143 and the contact barrier layers 142 by performing a selective etch process. In this process, rising portions 140RI and recessed portions 140RE of the contact patterns 140 may be defined. The mask pattern M may include one of photoresist, polysilicon, and SOH. Next, the mask pattern M may be removed.

Referring to FIGS. 22A to 22C, the method may include forming insulating patterns 150 by performing a deposition process and forming a second interlayer insulating layer 172 on the second stopper layer 182 and the insulating patterns 150. The insulating patterns 150 may include blocking layers 151 conformally formed on inner walls of the insulating holes 150H and on the contact plugs 143 and the contact barrier layers 142 exposed in the insulating holes 150H, and filling layers 152 filling the insulating holes 150H on the blocking layers 151. The blocking layers 151 may include silicon nitride. The filling layers 152 may include silicon oxide. The second interlayer insulating layer 172 may include silicon nitride.

Referring to FIGS. 23A to 23C, the method may include forming via patterns 160 vertically passing through the second interlayer insulating layer 172 to be connected to upper surfaces of the contact plugs 143. The forming the via patterns 160 may include forming via holes 160H vertically passing through the second interlayer insulating layer 172 and exposing the upper surfaces of the contact plugs 143 by performing by an etch process, conformally forming via barrier layers 161 on the surfaces of the contact plugs 143 exposed in the via holes 160H and on inner walls of the via holes 160H, and forming via plugs 162 filling the via holes 160H on the via barrier layers 161. The method may further include performing a planarization process so that upper surfaces of the via patterns 160 are coplanar with a surface of the second interlayer insulating layer 172. The via barrier layers 161 may include a barrier metal compound such as TiN, and the via plugs 162 may include a metal such as W.

Next, referring to FIGS. 16A to 16C, the method may include forming interconnections 165 on the via patterns 160, and forming a third interlayer insulating layer 173 covering the interconnections 165. The interconnections 165 may include a metal such as W. The third interlayer insulating layer 173 may include silicon oxide.

Figure 24A:
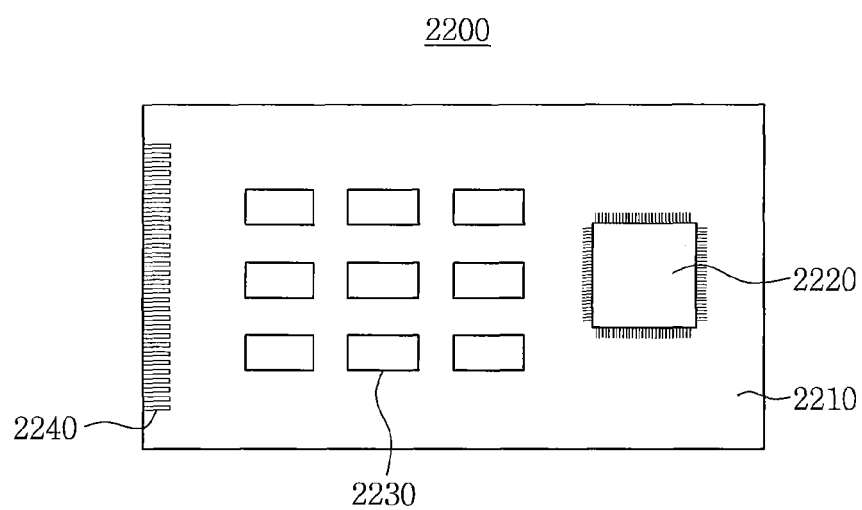
FIG. 24A is a diagram conceptually illustrating a semiconductor module in accordance with example embodiments of the inventive concept.

FIG. 24A is a diagram schematically illustrating a semiconductor module 2200 in accordance with example embodiments of the inventive concept. Referring to FIG. 24A, the semiconductor module 2200 in accordance with the embodiment of the inventive concept may include a processor 2220 and semiconductor devices 2230, mounted on a module substrate 2210. The processor 2220 and the semiconductor devices 2230 may include at least one of the semiconductor devices in accordance with various embodiments of the inventive concept. Conductive input/output terminals 2240 may be disposed on at least one side of the module substrate 2210.

Figure 24B:
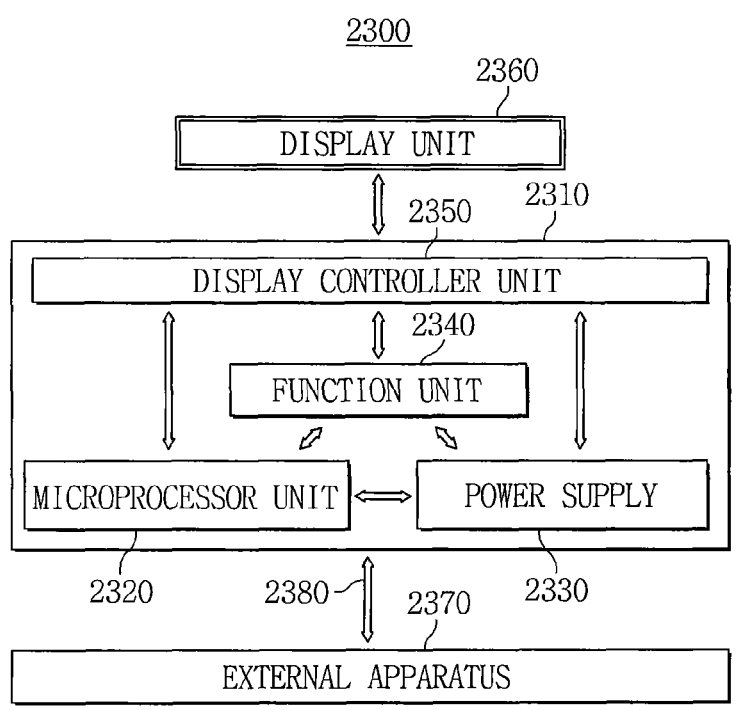
FIGS. 24B and 24C are block diagrams conceptually illustrating electronic systems in accordance with example embodiments of the inventive concept.
Figure 24C:
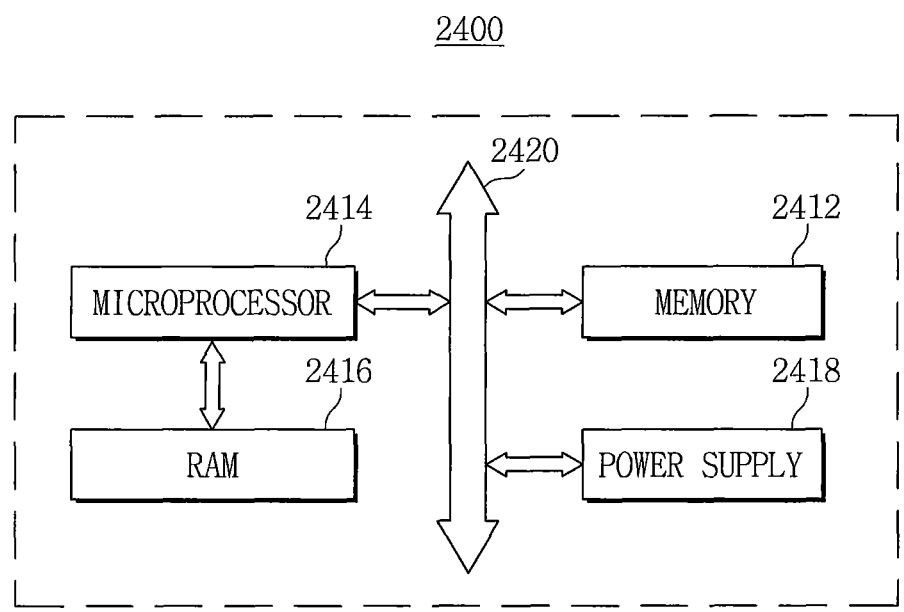

FIGS. 24B and 24C are block diagrams conceptually illustrating electronic systems 2300 and 2400 in accordance with example embodiments of the inventive concept. Referring to FIG. 24B, the electronic system 2300 in accordance with the embodiment of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard having a printed circuit board (PCB), and/or a case. The microprocessor unit 2320, the power supply 2330, the function unit 2340, and the display controller unit 2350 may be installed or arranged on an upper surface or an inside of the body 2310. A display unit 2360 may be disposed on an upper surface or an inside/outside of the body 2310. The display unit 2360 may display an image processed by the display controller unit 2350. For example, the display unit 2360 may include a liquid crystal display (LCD), an active matrix organic light emitting diode (AMOLED), or a variety of display panels. The display unit 2360 may include a touch-screen. Accordingly, the display unit 2360 may have an input/output function. The power supply 2330 may supply a current or voltage to the microprocessor unit 2320, the function unit 2340, and the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a light, an audio and video playback processor, a wireless transmission/reception antenna, a speaker, a microphone, a USB port, and other units having various functions. The microprocessor unit 2320 or the function unit 2340 may include at least one of semiconductor devices in accordance with various embodiments of the inventive concept.

Referring to FIG. 24C, the electronic system 2400 may include a microprocessor 2414, a memory system 2412, and a user interface 2418 which perform data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 can be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory system 2412 may store codes for operating the microprocessor 2414, data processed by the microprocessor 2414, or external input data. The memory system 2412 may include a memory controller, a hard disk, or a solid state drive (SSD). The microprocessor 2414, the RAM 2416, and/or the memory system 2412 may include one of semiconductor devices in accordance with various embodiments of the inventive concept.

In the semiconductor device in accordance with the embodiments of the inventive concept, since an area of mutually facing surfaces of a gate electrode and a contact pattern, or an area of mutually facing surfaces of adjacent contact patterns are reduced, parasitic capacitance may be reduced.

The semiconductor device in accordance with the embodiments of the inventive concept may be driven and operated under a low voltage and with low currents, and may have low power consumption and a high operation speed, since parasitic capacitance between a gate electrode and a contact pattern or between adjacent contact patterns is reduced.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device comprising:
    a gate pattern and a contact pattern disposed on an active region,
    wherein the gate pattern comprises a gate insulating layer and a gate electrode,
    wherein the contact pattern comprises a recessed portion near the gate pattern and a rising portion away from the gate pattern, and
    wherein an upper surface of the recessed portion is lower than an upper surface of the rising portion.

2. The semiconductor device of claim 1, wherein the gate pattern further comprises a surface insulating pattern disposed between the active region and the gate insulating layer,
    the surface insulating pattern includes oxidized silicon,
    the gate insulating layer includes a metal oxide, and
    the gate insulating layer has a U-shaped cross-section to surround side surfaces of the gate electrode.

3. The semiconductor device of claim 1, further comprising an insulating pattern on the recessed portion of the contact pattern.

4. The semiconductor device of claim 3, wherein the insulating pattern comprises:
    an insulating blocking layer conformally formed on a surface of the active region exposed in an insulating hole and inner walls of the insulating holes; and
    an insulating filling layer filling the insulating hole on the insulating blocking layer.

5. The semiconductor device of claim 1, further comprising a conductive via pattern on the rising portion of the contact pattern.

6. The semiconductor device of claim 1, further comprising source/drain regions protruding from the active region,
    wherein the source/drain regions include one of a SiGe layer and a Si layer, which is epitaxially grown, and
    wherein the contact pattern comprises:
    a silicide layer contacting the source/drain regions;
    a contact barrier layer on the silicide layer; and
    a contact plug pattern on the contact barrier layer.

7. The semiconductor device of claim 6, wherein the source/drain regions are on a plurality of bar shapes to be connected to each other in a form of a bridge.

8. The semiconductor device of claim 6, further comprising:
    an isolation region defining the active region; and
    an air gap between the source/drain regions and the active region and isolation region.

9. The semiconductor device of claim 1, wherein the contact pattern includes a first contact pattern and a second contact pattern disposed in both sides of the gate pattern to have mirrored shapes.

10. The semiconductor device of claim 1, wherein the upper surface of the recessed portion is lower than an upper surface of the gate electrode, and the upper surface of the rising portion is at an equal level to or higher than the upper surface of the gate electrode.

11. A semiconductor device, comprising:
    a gate pattern disposed on an active region, the gate pattern comprising a gate electrode;
    a contact pattern disposed adjacent to the gate pattern on the active region; and
    an insulating pattern and a via pattern on the contact pattern,
    wherein the contact pattern comprises:
    a rising portion having an upper surface disposed at an equal level to or higher than an upper surface of the gate electrode; and
    a recessed portion having an upper surface lower than the upper surface of the rising portion,
    wherein the insulating pattern is on the recessed portion, and
    wherein the via pattern is on the rising portion.

12. The semiconductor device of claim 11, wherein the gate pattern comprises:
    a gate insulating layer directly on the active region;
    a gate barrier layer on the gate insulating layer; and
    the gate electrode on the gate barrier layer,
    wherein the gate barrier layer surrounds side surfaces of the gate electrode, and
    wherein the gate insulating layer surrounds outer side surfaces of the gate barrier layer.

13. The semiconductor device of claim 11, wherein the insulating pattern comprises:
    an insulating blocking layer conformally formed on the upper surface of the recessed portion and side surfaces of the rising portion; and
    an insulating filling layer on the insulating blocking layer,
    wherein an upper end portion of the blocking layer is coplanar with an upper end portion of the insulating filling layer.

14. The semiconductor device of claim 11, further comprising an interlayer insulating layer disposed on the contact pattern and the insulating pattern,
    wherein the via pattern comprises:
    a via hole vertically passing through the interlayer insulating layer to expose the upper surface of the rising portion of the contact pattern;
    a conductive via barrier layer conformally formed on the upper surface of the rising portion exposed in the via hole and inner walls of the via hole; and
    a conductive via plug filling the via hole on the conductive via barrier layer.

15. The semiconductor device of claim 11, wherein the contact pattern comprises:
a silicide layer on the active region;
a contact barrier layer on the silicide layer; and
a contact plug on the contact barrier layer.

16. A semiconductor device, comprising:
isolation regions defining a plurality of parallel active regions, wherein the isolation regions includes trenches recessed such that the active regions have protruding shapes, and trench insulators partially filling the trenches to expose side surfaces of the active regions;
a gate pattern on the active regions, wherein the gate pattern includes a gate insulating layer that is directly on upper surfaces and the exposed side surfaces of the active regions and a gate electrode;
source/drain regions disposed on the active regions;
a contact pattern disposed on the source/drain regions, wherein the contact pattern includes a silicide layer directly on the source/drain regions, a contact barrier layer disposed on the silicide layer, and a contact plug disposed on the contact barrier layer, and the contact pattern comprises a rising portion having an upper surface higher than an upper surface of the gate electrode, and a recessed portion having an upper surface lower than the upper surface of the rising portion; and
a via pattern disposed on the rising portion of the contact pattern.

17. The semiconductor device of claim 16, further comprising:
an insulating blocking layer conformally formed on the upper surface of the recessed portion and side surfaces of the rising portion; and
an insulating pattern including an insulating filling layer disposed on the blocking layer.

18. The semiconductor device of claim 16, wherein the source/drain regions are laterally connected in a form of a bridge.

19. The semiconductor device of claim 18, further comprising air gaps between the source/drain regions and the trench insulators.

20. The semiconductor device of claim 16, wherein the contact pattern has an L-shaped cross-section viewed in a first direction and an 1-shaped cross-section viewed in a second direction, or wherein the contact pattern has 1-shaped cross-sections viewed in the both first and second directions.

* * * * *